(12) United States Patent
Kobayashi et al.

(10) Patent No.: US 10,014,675 B2
(45) Date of Patent: Jul. 3, 2018

(54) ELECTRICAL JUNCTION BOX AND CONNECTOR HOUSING

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

(72) Inventors: Takehito Kobayashi, Mie (JP); Yoshikazu Sasaki, Mie (JP); Shigeki Yamane, Mie (JP); Yukinori Kita, Mie (JP); Tomohiro Ooi, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 15/320,059

(22) PCT Filed: Jun. 19, 2015

(86) PCT No.: PCT/JP2015/067773
§ 371 (c)(1),
(2) Date: Dec. 19, 2016

(87) PCT Pub. No.: WO2015/194666
PCT Pub. Date: Dec. 23, 2015

(65) Prior Publication Data
US 2017/0155237 A1 Jun. 1, 2017

(30) Foreign Application Priority Data

Jun. 19, 2014 (JP) .................................. 2014-125961
Sep. 9, 2014 (JP) .................................. 2014-183281

(51) Int. Cl.
*H01R 12/00* (2006.01)
*H02G 3/16* (2006.01)
(Continued)

(52) U.S. Cl.
CPC .............. *H02G 3/16* (2013.01); *H01R 13/512* (2013.01); *H01R 13/516* (2013.01); *H02G 3/081* (2013.01); *H02G 3/14* (2013.01)

(58) Field of Classification Search
CPC . H02G 3/14; H02G 3/081; H02G 3/16; H01R 13/516; H01R 13/512
(Continued)

(56) References Cited

U.S. PATENT DOCUMENTS 6,919,509 B2 * 7/2005 Oda ..................... H01R 9/226
174/50
7,364,438 B2 * 4/2008 Sasaki .................. H05K 5/063
361/752

(Continued)

FOREIGN PATENT DOCUMENTS

DE  3833146 A1  3/1989
DE  4240755 A1  6/1994
(Continued)

OTHER PUBLICATIONS

European Search Report for EP15809193.4, dated Jan. 20, 2017, 6pp.
(Continued)

*Primary Examiner* — Abdullah Riyami
*Assistant Examiner* — Nelson R Burgos-Guntin
(74) *Attorney, Agent, or Firm* — Dinsmore & Shohl LLP

(57) ABSTRACT

An electrical junction box includes: a circuit board in which a conductive path is formed on an insulating plate; a connector housing having a hood portion in the shape of a hood and an inner wall that closes the hood portion, wherein
(Continued)

a terminal insertion hole; is provided in the inner wall; a connector terminal that is inserted from a rear face of the connector housing into the terminal insertion hole; through the inner wall and projects into the hood portion; a base member to which the connector housing is fastened, and that is different from the circuit board; and a screw that fastens the connector housing to the base member in a state where the connector terminal is inserted into the terminal insertion hole. The connector housing includes a catch portion that catches the circuit board when the connector housing is fastened with the screw to the base member.

15 Claims, 21 Drawing Sheets

(51) Int. Cl.
    *H01R 13/516*     (2006.01)
    *H02G 3/08*     (2006.01)
    *H02G 3/14*     (2006.01)
    *H01R 13/512*     (2006.01)

(58) Field of Classification Search
    USPC .................................... 439/76.1, 76.2, 949
    See application file for complete search history.

(56) References Cited

U.S. PATENT DOCUMENTS

| | | | |
|---|---|---|---|
| 7,931,479 B1 * | 4/2011 | De La Reza | ....... B60R 16/0238 |
| | | | 439/76.2 |
| 2003/0147204 A1 | 8/2003 | Koike et al. | |
| 2004/0014337 A1 | 1/2004 | Throum | |
| 2004/0014356 A1 | 1/2004 | Hallitschke et al. | |
| 2008/0009154 A1 | 1/2008 | Kanou et al. | |
| 2009/0137135 A1 * | 5/2009 | Yamaguchi | .......... H01R 13/521 |
| | | | 439/76.1 |
| 2012/0064741 A1 * | 3/2012 | Kawaguchi | .......... H05K 5/0026 |
| | | | 439/76.2 |
| 2014/0154897 A1 * | 6/2014 | Makino | .................... H01R 9/16 |
| | | | 439/76.2 |

FOREIGN PATENT DOCUMENTS

| | | |
|---|---|---|
| DE | 102006006078 A1 | 9/2007 |
| DE | 102008054384 A1 | 6/2010 |
| DE | 102012203634 A1 | 9/2013 |
| EP | 1248322 A2 | 10/2002 |
| JP | 2006054948 A | 2/2006 |
| JP | 2010041807 A | 2/2010 |
| JP | 2012209308 A | 10/2012 |
| JP | 2013005483 A | 1/2013 |
| JP | 2013206592 A | 10/2013 |
| JP | 2014112990 A | 6/2014 |
| WO | 99/54973 A1 | 10/1999 |
| WO | 2006057156 A1 | 6/2006 |

OTHER PUBLICATIONS

International Search Report dated Sep. 15, 2015 pertaining to International Application No. PCT/JP2015/067773.

Search Report for European Application No. 15809193.4, dated Jun. 13, 2017, 4 pp.

* cited by examiner

ELECTRICAL JUNCTION BOX AND CONNECTOR HOUSING

CROSS-REFERENCE TO RELATED APPLICATIONS

This application is the U.S. national stage of PCT/JP2015/067773 filed Jun. 19, 2015, which claims priority of Japanese Patent Application JP 2014-125961 filed Jun. 19, 2014, and Japanese Patent Application JP 2014-183281 filed Sep. 9, 2014.

FIELD OF THE INVENTION

The present invention relates to an electrical junction box and a connector housing.

BACKGROUND OF THE INVENTION

Conventionally, electrical junction boxes are known in which a substrate configured by an insulating plate and a conductive path formed thereon is accommodated in a casing. In JP 2013-5483A, a printed wiring board in which a circuit pattern is printed on an insulating plate is accommodated in a casing, and a first attachment portion and a second attachment portion extend from a connector block toward the casing. The first attachment portion is fastened with screws to an upper cover of the casing, and the second attachment portion is fastened with screws to the printed wiring board.

Incidentally, when a printed wiring board is fastened with screws, a large force is applied during screwing to those regions of the printed wiring board that are in the vicinity of the screws, and thus circuit patterns cannot be formed in those regions. If there are such portions in which circuit patterns cannot be formed, circuit patterns cannot be efficiently arranged on the printed wiring board, resulting in the problem that the size of the printed wiring board cannot be made smaller.

The present invention was made in view of these circumstances, and it is an object thereof to increase the regions in which a conductive path can be formed on a circuit board.

SUMMARY

A technique described in this specification is directed to an electrical junction box, including: a circuit board in which a conductive path is formed on an insulating plate; a connector housing having a hood portion in the shape of a hood and an inner wall that closes the hood portion, wherein a terminal insertion hole is provided in the inner wall; a connector terminal that is inserted from a rear face of the connector housing into the terminal insertion hole through the inner wall and projects into the hood portion; a base member to which the connector housing is fastened, and that is different from the circuit board; and a fastening portion that fastens the connector housing to the base member in a state where the connector terminal is inserted into the terminal insertion hole; wherein the connector housing includes a catch portion that catches the circuit board in a state where the connector housing is fastened with the fastening portion to the base member.

A technique described in this specification is directed to a connector housing that is mountable in a base member, including: a hood portion in the shape of a hood; an inner wall that closes the hood portion, and is provided with a terminal insertion hole into which a connector terminal is insertable from a rear face of the inner wall; a fastenable portion to which a fastening portion is fastened with respect to the base member; and a catch portion that catches a circuit board in which a conductive path is formed on an insulating plate, in a state where the fastenable portion is fastened with the fastening portion to the base member.

With this configuration, the portion where the catch portion catches the circuit board in a state where the connector housing is fastened with the fastening portion to the base member, is not subjected to fastening with a fastening portion, and thus there is no large force, during fastening with a fastening portion, applied to the circuit board, and a conductive path can be formed on the circuit board in the vicinity of the portion where the catch portion catches the circuit board. Thus, regions in which a conductive path can be formed on the circuit board can be increased. Furthermore, since the number of points that are fastened with fastening portions is reduced, the number of fastening portions can be reduced.

It is preferable that embodiments of the present invention have the following aspects.

The fastening portion is a screw.

The base member includes a holding portion that holds a position of that portion of the circuit board that is on the side of the connector housing.

Accordingly, the position of that portion of the circuit board that is formed on the side of the connector housing can be held.

A position holding hole is formed through the circuit board, and the holding portion includes a projecting portion that is inserted into the position holding hole.

Accordingly, the in-plane position of the circuit board can be held with a simple configuration.

The catch portion includes a pair of gripping portions that grip the circuit board from both faces.

Accordingly, since the pair of gripping portions grip the circuit board, the position of the circuit board can be held in the direction that is orthogonal to the board surfaces of the circuit board.

The base member includes a guide portion that guides the connector housing during assembly of the connector housing, and the connector housing includes a receiving portion that receives the guide portion to be guided therealong, and the catch portion is formed on the receiving portion.

Accordingly, the configuration of the receiving portion for guiding the connector housing can be used to form a catch portion.

The circuit board is provided with a cut-out portion formed by cutting away a corner of the circuit board, and the receiving portion enters the cut-out portion.

According to the present invention, it is possible to increase regions in which a conductive path can be formed on a circuit board.

DETAILED DESCRIPTION

Embodiment 1

Hereinafter, Embodiment 1 will be described with reference to FIGS. 1 to 9.

An electrical junction box 10 is arranged, for example, in a power supply path between a power source such as a battery of a vehicle such as an electric automobile or a hybrid automobile, and a load constituted by a vehicle-mounted electrical equipment such as a lamp, a drive motor, or the like, and can be used, for example, for a DC-DC converter, an inverter, and the like. In the description below, the vertical direction will be indicated using the direction in FIG. 2 as a reference, and the front-rear direction will be described taking the left side in FIG. 3 as a front direction and the right side as a rear direction.

Electrical Junction Box 10

Figure 1:
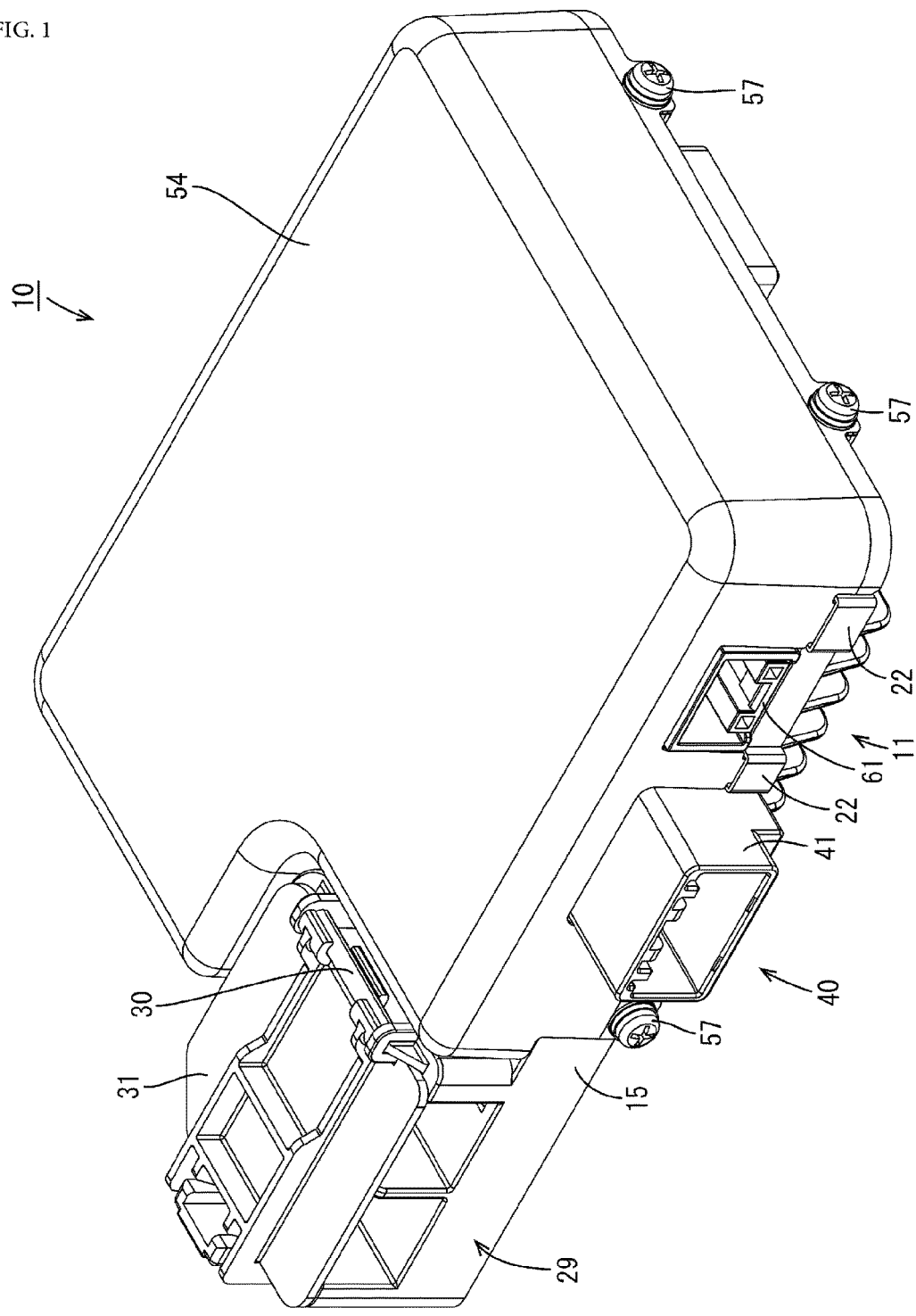
FIG. 1 is a perspective view showing an electrical junction box of Embodiment 1.
Figure 2:
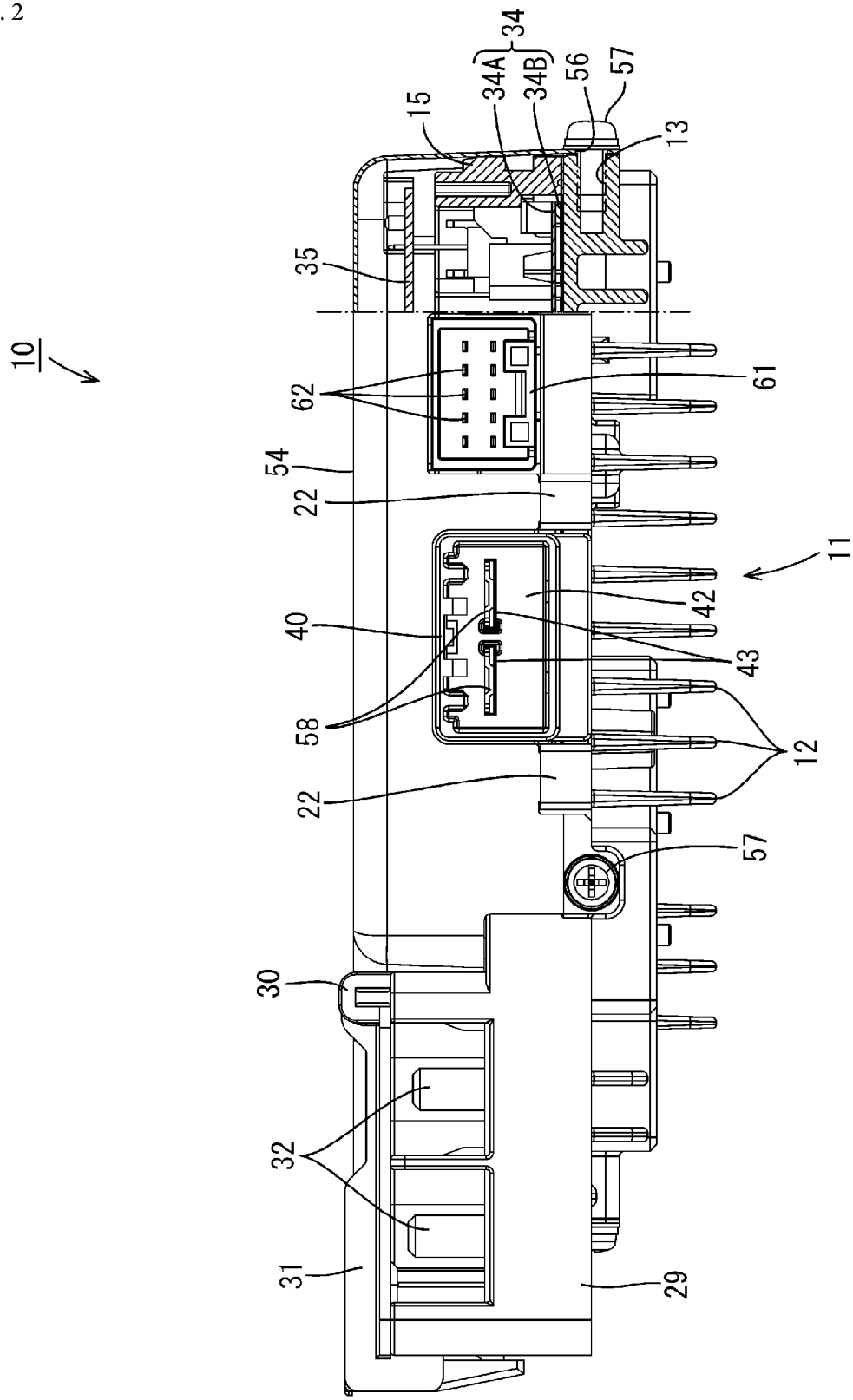
FIG. 2 is a front view showing the electrical junction box.

As shown in FIG. 2, the electrical junction box 10 includes a heat dissipation member 11, a base member 15 made of synthetic resin placed on the upper face of the heat dissipation member 11, two circuit boards 34 and 35 fastened to the base member 15, a connector housing 40 mounted in the base member 15, and a shield cover 54.

The heat dissipation member 11 is made of a metal material having a high thermal conductivity such as an aluminum alloy or a copper alloy, and has a flat upper face and a lower face having a large number of heat dissipation fins 12 that are arranged side by side. Screw holes 13 are formed through the outer perimeter of the heat dissipation member 11.

The shield cover 54 is formed by punching and bending a metal sheet made of aluminum or the like, and has a lower edge having through tabs (not shown) that are inserted into cover through portions 22 of the base member 15 and through holes 56 into which screws 57 are inserted. If the screws 57 are inserted into the through holes 56 and are screwed into the screw holes 13 of the heat dissipation member 11, the shield cover 54 is fastened to the heat dissipation member 11 and is grounded via the heat dissipation member 11.

Base Member 15

The base member 15 includes a main body 16 formed in the shape of a frame along the peripheral edge of the heat dissipation member 11, and an attachment portion 29 that is arranged outside the shield cover 54 and to which ends of electric wires connected to an external power source (not shown) can be connected.

The attachment portion 29 accommodates positive and negative power source-side terminals 32, separates the power source-side terminals 32 from the outside, and includes a lid portion 31 that can be opened and closed with a hinge portion 30. Terminals at ends of electric wires connected to the external power source are attached to the power source-side terminals 32. The electric power from the external power source is supplied via the power source-side terminals 32 to the circuit boards 34 and 35.

Figure 6:
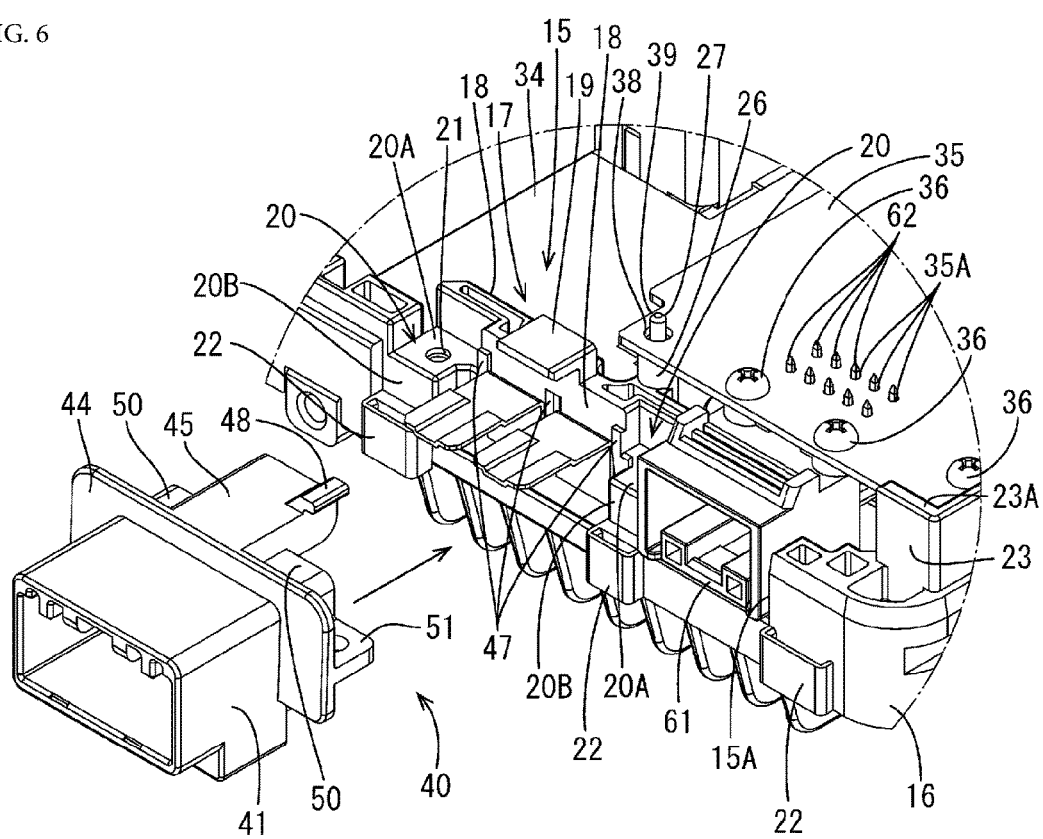
FIG. 6 is a perspective view showing the manner in which the connector housing is mounted in a base member.
Figure 7:
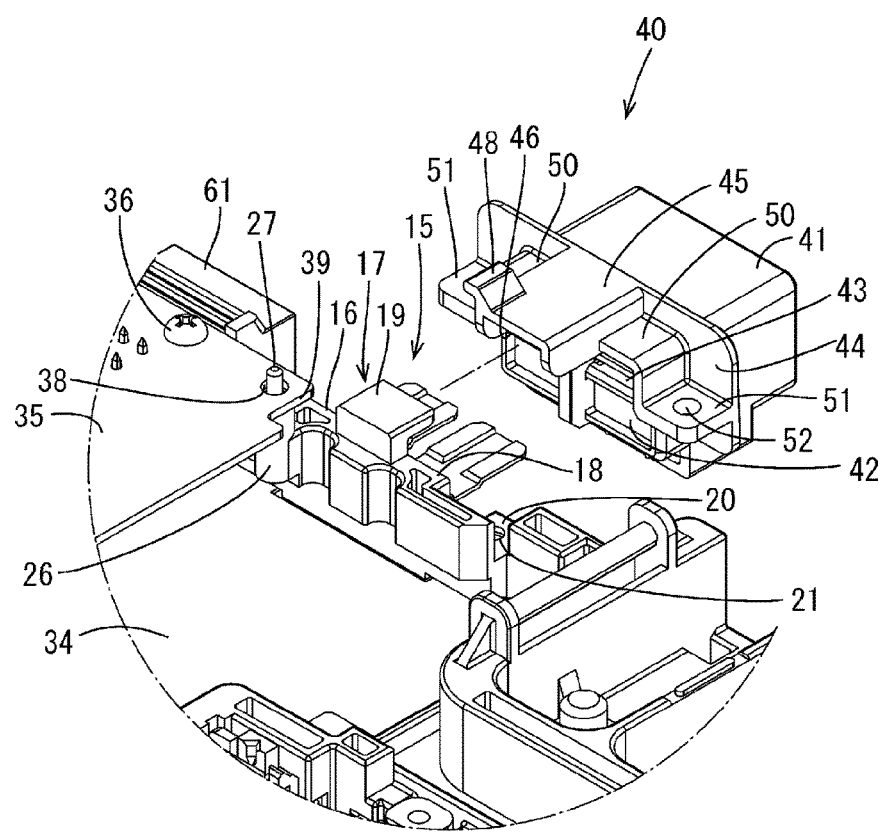
FIG. 7 is a perspective view showing the manner in which the connector housing is mounted in the base member, as viewed in a direction that is different from that in FIG. 6.
Figure 8:
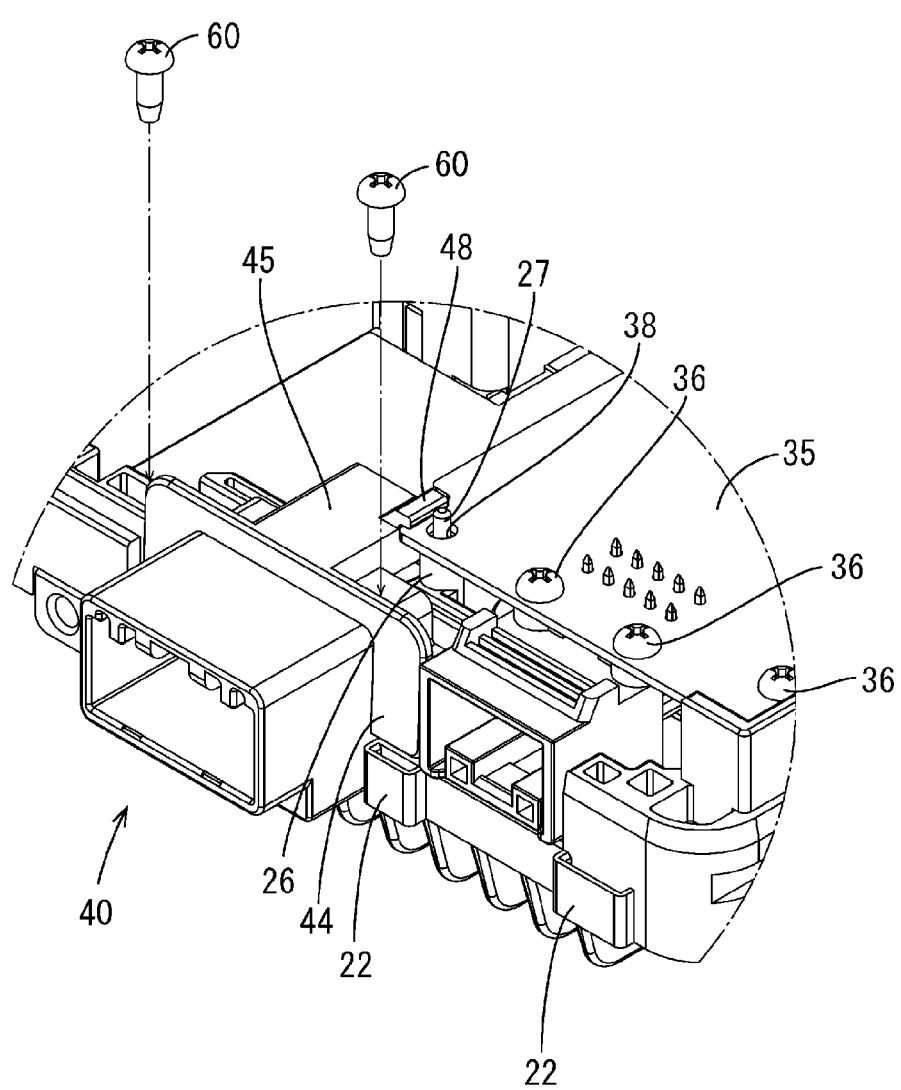
FIG. 8 is a perspective view showing the manner in which the connector housing is fastened with screws to the base member.
Figure 9:
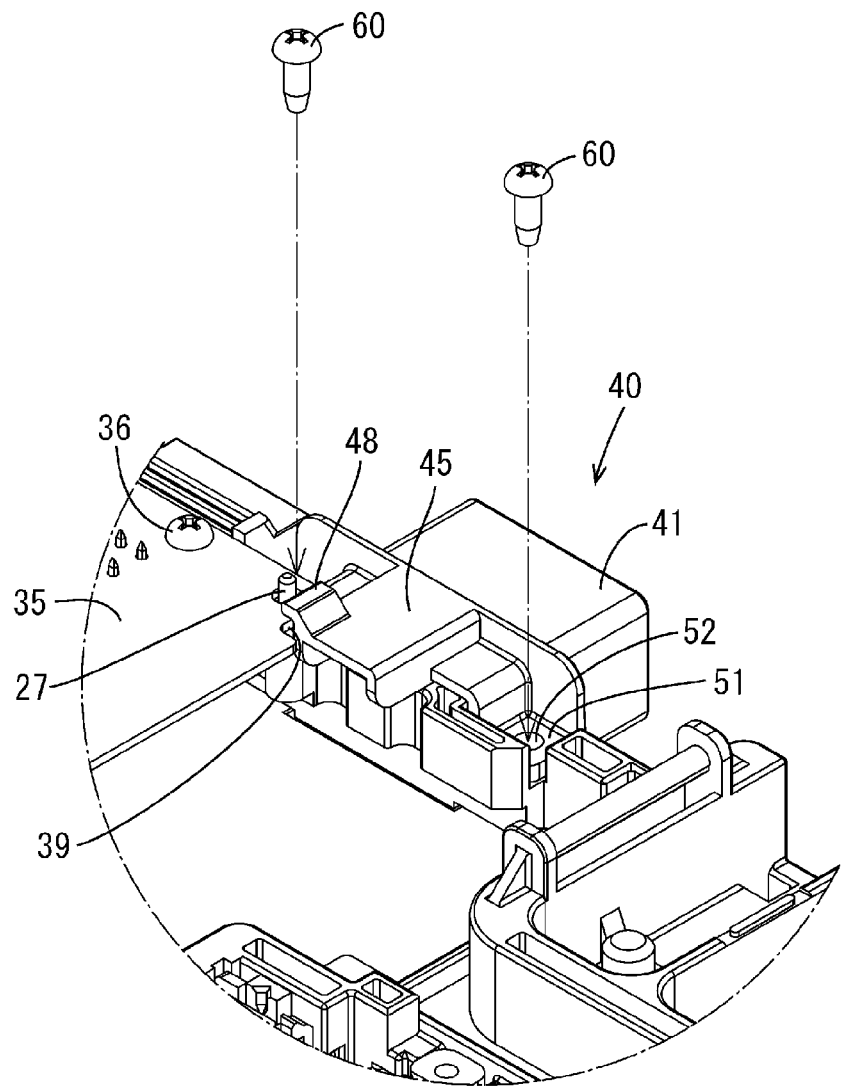
FIG. 9 is a perspective view showing the manner in which the connector housing is fastened with screws to the base member as viewed in a direction that is different from that in FIG. 8.

As shown in FIGS. 6 and 7, the main body 16 includes a connector mounting portion 17 in which the connector housing 40 is mounted. The connector mounting portion 17 includes opposing walls 18 standing upright in the shape of a band opposing the rear face of the connector housing 40, a pair of left and right pedestal portions 20 that are lower than the opposing walls 18 and on which the connector housing 40 is placed, and the cover through portions 22 into which the through tabs of the shield cover 54 are inserted.

The opposing walls 18 have a front face 18A that supports, from the rear, upright portions of connector terminals 58, which are bent in the shape of cranks. On the front face 18A, projecting ridges 47 extending in the vertical direction are formed on both sides of each connector terminal 58 such that the connector terminal 58 is fitted therebetween. A guide portion 19 projects forward at the middle in the horizontal direction of the upper end of the opposing walls 18. The guide portion 19 is in the shape of an "L", slightly projects upward from the upper end of the opposing walls 18, and projects forward in the shape of a plate having a constant width.

The upper faces of the pedestal portions 20 form rectangular placement faces 20A, and the front faces of the pedestal portions 20 form front stopping faces 20B that are in contact with the connector housing 40 when the connector housing 40 is mounted. The placement faces 20A are provided with screw holes 21 into which screws 60 (an example of "fastening portions") are screwed so that the circuit board 35 and the heat dissipation member 11 are fastened to each other. The cover through portions 22 are arranged in front of and below the pedestal portions 20, and have through holes extending therethrough in the vertical direction.

A control housing 61 is arranged adjacent to the connector mounting portion 17. The control housing 61 is open in the shape of an angular tube into which a corresponding connector housing can be fitted, and is made of synthetic resin, wherein L-shaped control terminals 62 extend through the inner wall of the control housing 61. The control housing 61 is fastened with screws 36 to the circuit board 35, and is fitted between an end portion 15A of a peripheral wall forming the outer perimeter of the base member 15 and the connector housing 40.

In the base member 15, a columnar holding portion 26 projects upward from a position below that one corner of the circuit board 35 that is formed on the side of the connector housing 40. The front end (upper end) of the holding portion 26 is provided with a columnar projecting portion 27 whose outer diameter is narrowed in a stepwise manner. If the projecting portion 27 is inserted into a position holding hole 38 of the circuit board 35, the circuit board 35 is prevented from moving in a direction along the board surface. The lower face of the circuit board 35 is placed on that step face of the holding portion 26 that is contiguous with the projecting portion 27 and from which the outer diameter is reduced.

Substrate support members 23 are arranged under the other three corners of the circuit board 35. The upper ends of the substrate support members 23 have L-shaped fitting portions 23A that are along the edges of the circuit board 35. If the corners of the circuit board 35 are fitted to the inner sides of the fitting portions 23A, the circuit board 35 is positioned. In a state where the control housing 61 is attached to the circuit board 35, the circuit board 35 is fastened with the plurality of screws 36 to the substrate support members 23.

Circuit Boards 34 and 35

Figure 5:
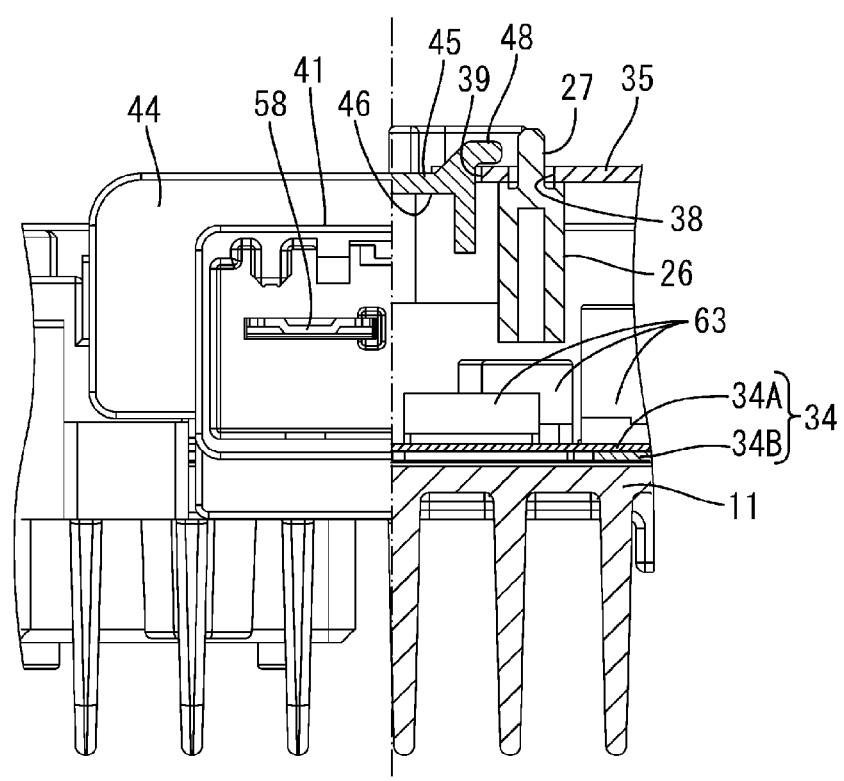
FIG. 5 shows a cross-sectional view and a front view, as viewed from the line B-B in FIG. 4.

The circuit boards 34 and 35 are both rectangular, and are configured by an insulating plate made of an insulating material on which a conductive path (not shown) made of copper foil or the like is printed. As shown in FIG. 5, electronic components 63 are mounted on the circuit boards 34 and 35. The electronic components 63 are switching elements (e.g., mechanical relays, FET (field effect transistor) relays, etc.).

The circuit board 34 is fitted inside the main body 16, is secured with an insulating adhesive to the heat dissipation member 11, and has a configuration in which a bus bar 34B formed by punching a metal sheet into the shape of a conductive path is placed on a printed wiring board 34A. The end of the bus bar 34B is bent at a right angle and stands upright, and the connector terminals 58 bent forward at a right angle are unitarily formed with the bus bar 34B. The circuit board 35 has no bus bar, and is configured by an insulating plate on which a conductive path pattern is printed.

The circuit board 35 has an area that is smaller than that of the circuit board 34, and is arranged above the circuit board 34 via a gap so as to be parallel to the circuit board 35. Note that the circuit board 34 and the circuit board 35 are not electrically connected to each other.

As shown in FIGS. 6 and 7, through holes 35A into which the plurality of control terminals 62 fastened to the control housing 61 are inserted, a plurality of screw holes (not shown) that are arranged at screwing points and into which the shanks of the screws 36 are inserted, and a single position holding hole 38 into which the projecting portion 27 of the holding portion 26 is inserted are formed through the circuit board 35. The position holding hole 38 is in the shape of a perfect circle into which the projecting portion 27 of the holding portion 26 is inserted. That portion of the circuit board 35 that is formed on the side of the connector housing 40 is provided with a cut-out portion 39 formed by cutting away the corner in a rectangular shape. When the connector housing 40 is mounted in the base member 15, the edge of a receiving portion 45 (described later) of the connector housing 40 enters the cut-out portion 39.

Connector Housing 40

The connector housing 40 is made of synthetic resin, and includes a hood portion 41 in the shape of a hood (the shape that is open forward, covering a corresponding connector housing—not shown), an inner wall 42 that closes the hood portion 41, a flange portion 44 projecting in the shape of a flange from the side faces, a receiving portion 45 that extends rearward and into which the guide portion 19 is received, and fastenable portions 51 having a portion into which the screws 60 are inserted so as to be fastened with the screws to the pedestal portions 20. The hood portion 41 is in the shape of an angular tube.

Figure 3:
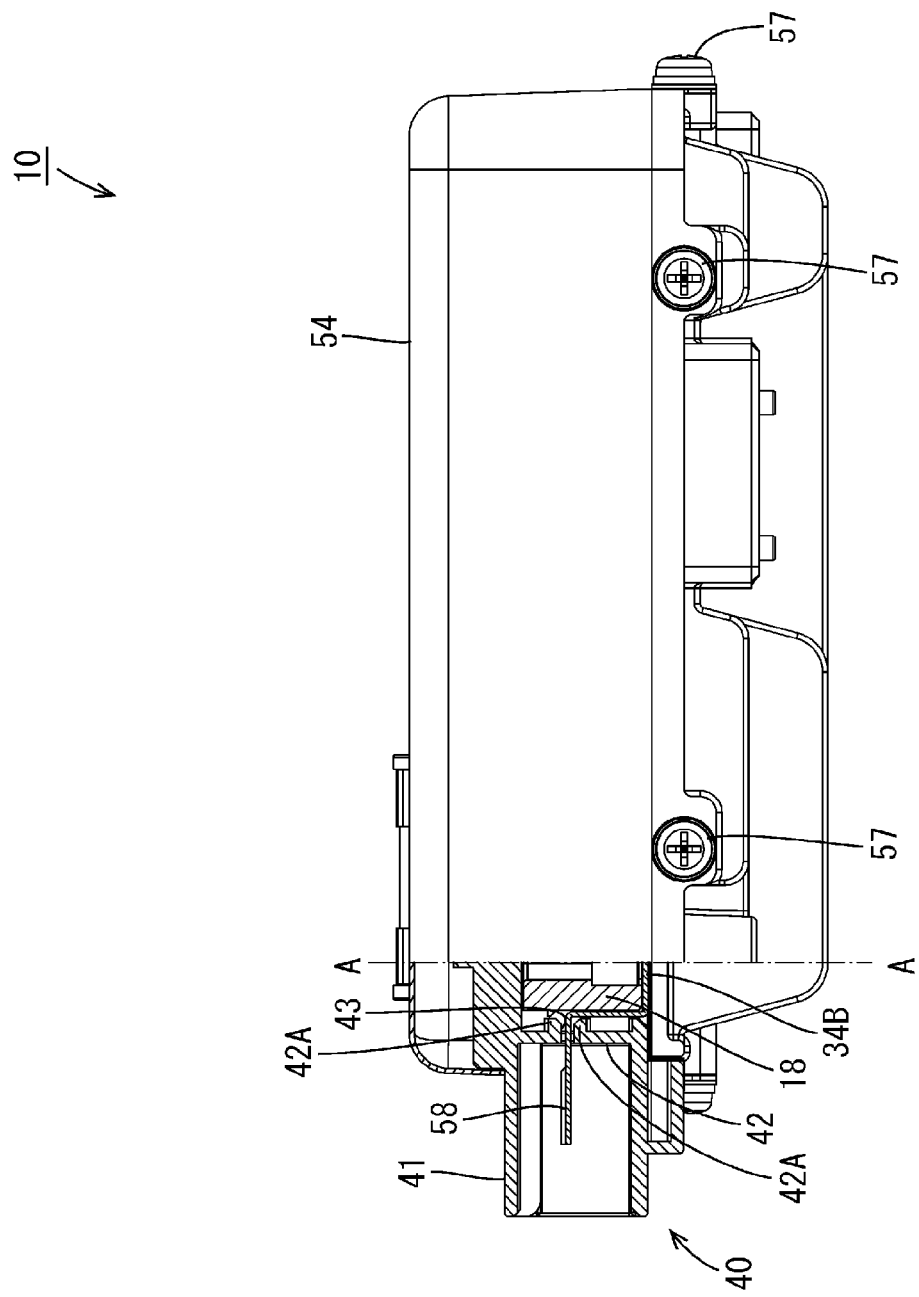
FIG. 3 is a side view of the electrical junction box showing the front side of the line A-A in a vertical cross-sectional view.
Figure 4:
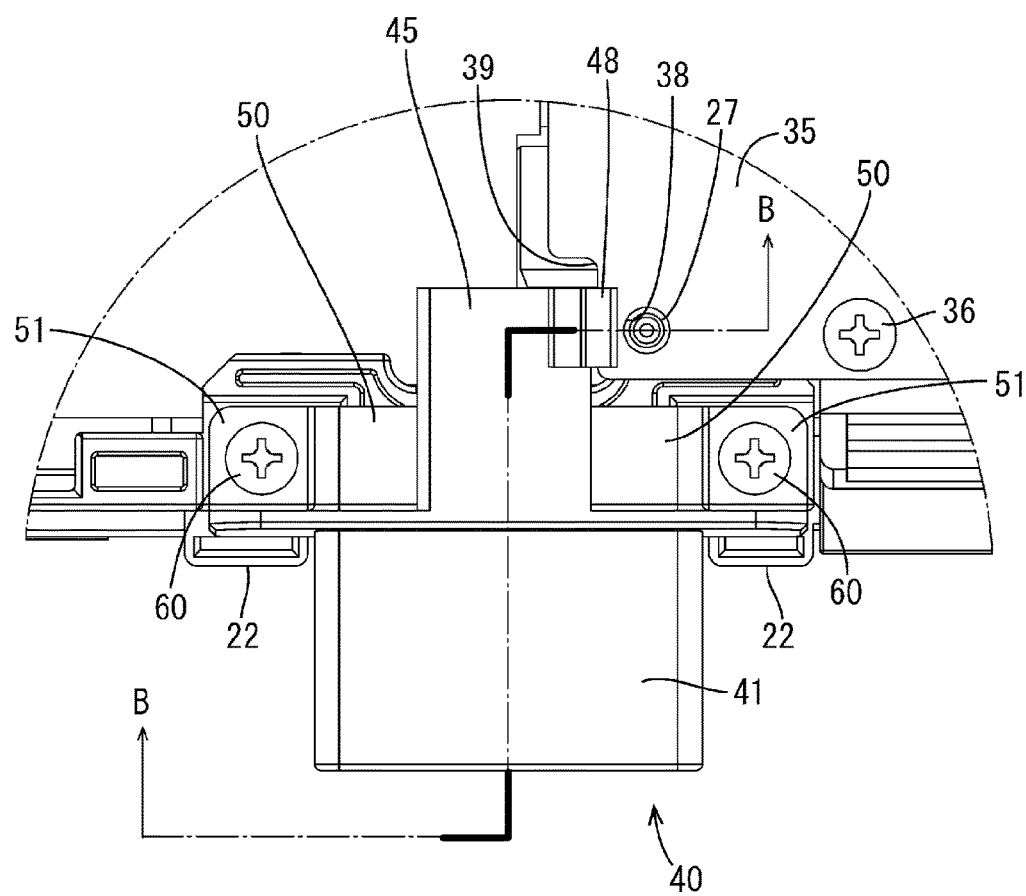
FIG. 4 is an enlarged plan view showing the portion in which a connector housing is mounted.

As shown in FIGS. 2 and 3, a plurality of terminal insertion holes 43 into which the connector terminals 58 are respectively inserted are provided in the inner wall 42. The terminal insertion holes 43 are formed in a size that has slight gaps between the terminal insertion holes 43 and the connector terminals 58. A pair of upper and lower projecting portions 42A project rearward from that rear face of the inner wall 42 that is contiguous with the terminal insertion holes 43. The terminal insertion holes 43 have rear ends whose diameters are increased toward the rear, and, when the connector terminals 58 are inserted into the terminal insertion holes 43, the insertion of the connector terminals 58 is guided along the increased diameter portions of the terminal insertion holes 43. As shown in FIGS. 6 and 7, the flange portion 44 is formed along substantially the upper half of the outer perimeter at the middle in the front-rear direction of the connector housing 40 such that the projecting length in the horizontal direction is larger than the projecting length in the vertical direction. When the flange portion 44 abuts against the front stopping faces 20B of the pedestal portions 20, the connector housing 40 is located at a correct position at which screwing can be performed. Note that the lower end of the connector housing 40 and the lower projecting portion 42A at the correct positions also abut against the connector terminals 58 and the base member 15.

The receiving portion 45 extends rearward in the shape of a thick-walled plate from the upper portion of the rear end of the hood portion 41, and has a rear end whose bottom face forms a groove portion 46 into which the guide portion 19 is slidably fitted. A catch portion 48 that catches the upper face of the circuit board 35 laterally projects from a side edge of the rear end of the receiving portion 45. The catch portion 48 extends from a base end that is contiguous with the upper face of the receiving portion 45, to a position that is higher than the upper face of the receiving portion 45. As shown in FIG. 5, when the connector housing 40 is inserted to the correct position with respect to the connector terminals 58, the edge of the receiving portion 45 and the base end of the catch portion 48 enter the cut-out portion 39, and the horizontally extending front end of the catch portion 48 overlaps the upper portion of the edge of the cut-out portion 39.

On the rear face side of the inner wall 42, plate-like extending portions 50 laterally extend respectively from both side edges of the receiving portion 45. The extending portions 50 laterally extend in the shape of cranks and are unitarily contiguous with the rear face of the inner wall 42, covering the connector terminals 58 arranged thereinside. In the extending portions 50, both side ends whose heights are reduced in a stepwise manner form the pair of left and right fastenable portions 51. Through holes 52 into which the shanks of the screws 60 are inserted are formed through the fastenable portions 51.

Hereinafter, the assembly of the electrical junction box 10 will be described.

The base member 15 is attached to the upper face of the heat dissipation member 11, and the circuit board 34 is placed thereon. Furthermore, when the circuit board 35 to which the control housing 61 is attached is placed on predetermined points on the substrate support members 23, the projecting portion 27 of the holding portion 26 is inserted into the position holding hole 38. Then, the circuit board 35 is fastened with the screws 36 to the substrate support members 23 (FIG. 6).

Next, when the connector housing 40 is moved rearward from the rear face side, the receiving portion 45 of the connector housing 40 is guided along the guide portion 19, and the connector terminals 58 are inserted into the terminal insertion holes 43. When the connector housing 40 is further moved rearward, the connector housing 40 is located at a correct position at which screwing with the screws 60 can be performed. At this time, the catch portion 48 formed on the receiving portion 45 of the connector housing 40 overlaps the edge of the cut-out portion 39 of the circuit board 35 (at a position that is closer to the cut-out portion 39 than to the position holding hole 38). When the left and right fastenable portions 51 of the connector housing 40 are fastened with the screws 60 to the pedestal portions 20 (FIG. 8), a force applied during the screwing presses the connector housing 40 against the base member 15, and the catch portion 48 unitarily formed with the connector housing 40 presses the edge of the cut-out portion 39 of the circuit board 35 downward, and thus the position of that region of the circuit board 35 that is formed on the side of the connector housing 40 is held with respect to the base member 15 even without screwing.

Hereinafter, the actions and effects of the foregoing embodiment will be described.

According to Embodiment 1, the vicinity of a portion where the catch portion 48 catches the circuit board 35 in a state where the connector housing 40 is fastened with the screws 60 (fastening portions) to the base member 15 is not subjected to screwing, and thus no large force during screwing is applied to the circuit board 35, and a conductive path can be formed on the circuit board 35 in the vicinity of the portion where the catch portion 48 catches the circuit board 35. Thus, regions in which a conductive path can be formed on the circuit board 35 can be increased. Furthermore, since the number of screwing points is reduced, the number of screws can be reduced.

Furthermore, the base member 15 includes the holding portion 26 that holds the position of that portion of the circuit board 35 that is formed on the side of the connector housing 40.

Accordingly, regarding that portion of the circuit board 35 that is formed on the side of the connector housing 40, the in-plane position and the lower-side position of the circuit board 35 are held by the holding portion 26, and the upper side of the circuit board 35 is caught by the catch portion 48, and thus the position of that portion of the circuit board 35 that is formed on the side of the connector housing 40 can be held.

Moreover, the circuit board 35 is provided with the position holding hole 38, and the holding portion 26 includes the projecting portion 27 that is inserted into the position holding hole 38.

Accordingly, the in-plane position of the circuit board 35 can be held with a simple configuration.

Furthermore, the base member 15 includes the guide portion 19 that guides the connector housing 40 during assembly of the connector housing 40, the connector housing 40 includes the receiving portion 45 that extends toward the circuit board 35 and receives the guide portion 19 to be guided therealong, and the catch portion 48 is formed on the receiving portion 45.

Accordingly, the configuration of the receiving portion 45 extending toward the circuit board 35 in order to guide the connector housing 40 can be used to form the catch portion 48.

Moreover, the circuit board 35 is provided with the cut-out portion 39 formed by cutting away the corner, and the receiving portion 45 enters the cut-out portion 39.

Accordingly, the circuit board 35 can be prevented from being in contact with the receiving portion 45 even when the width of that portion of the circuit board 35 that is formed on the side of the connector housing 40 is made larger, and thus the area of the circuit board 35 can be increased.

Embodiment 2

Hereinafter, Embodiment 2 will be described with reference to FIG. 10. Embodiment 2 is different from Embodiment 1 in that it includes a catch portion 70 having a shape that is different from that of the catch portion 48. The other aspects of the configuration are the same as those in Embodiment 1, and thus the same constituent elements are denoted by the same reference numerals, and their description has been omitted.

Figure 10:
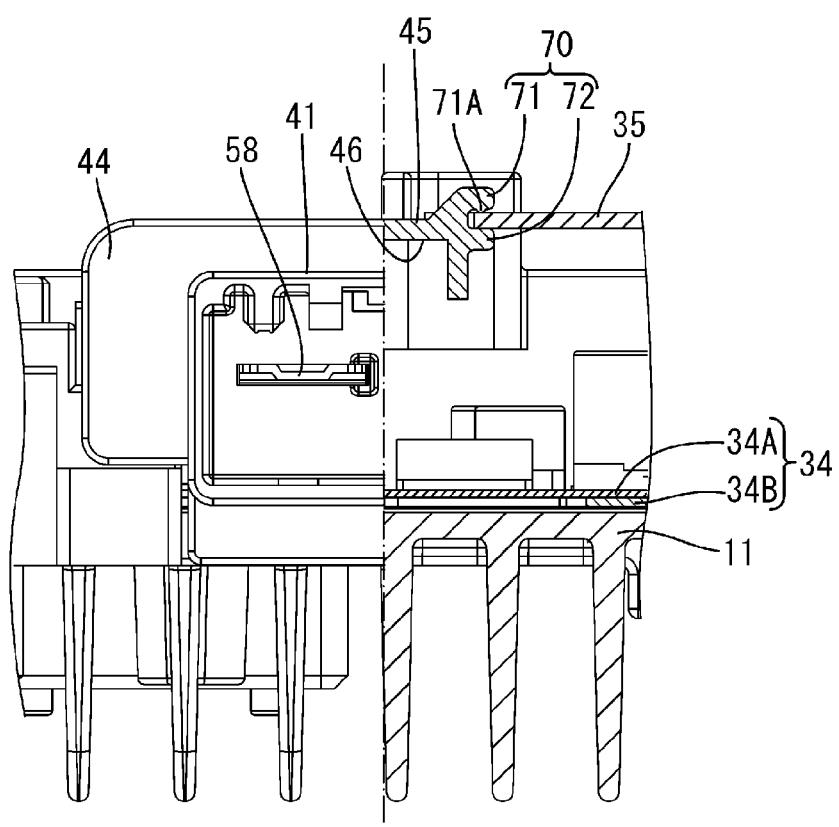
FIG. 10 shows a cross-sectional view and a front view of Embodiment 2, as viewed from a position corresponding to the line B-B in FIG. 4.

As shown in FIG. 10, the catch portion 70 includes a pair of upper and lower gripping portions 71 and 72 that grip the circuit board 35 from both sides. The pair of gripping portions 71 and 72 are in the shape of plates. The upper gripping portion 71 horizontally extends along relatively high positions, continuing to the upper face of the receiving portion 45, and includes a contact point portion 71A projecting downward. The lower gripping portion 72 horizontally extends along positions below the gripping portion 71 via a predetermined gap. The predetermined gap is set to a size that allows the pair of gripping portions 71 and 72 to grip the circuit board 35 while applying a slight force thereto.

When the left and right fastenable portions 51 of the connector housing 40 are fastened with the screws 60, a force applied during the screwing presses the connector housing 40 against the base member 15, and the catch portion 70 presses the edge of the cut-out portion 39 of the circuit board 35 downward, and thus the position of that region of the circuit board 35 that is formed on the side of the connector housing 40 is held with respect to the base member 15 even without screwing.

Accordingly, since the pair of gripping portions 71 and 72 grip the circuit board 35 from both faces, the position of the circuit board 35 can be held in the direction that is orthogonal to the board surfaces of the circuit board 35. Furthermore, since both faces of the circuit board 35 can be held, the configuration that holds a corner of the circuit board 35 from below such as the holding portion 26 of Embodiment 1 does not absolutely have to be provided on the base member 15, that is, the configuration of the base member 15 can be simplified.

Embodiment 3

A technique disclosed in this specification relates to an electrical junction box.

Conventionally, electronic controllers are known in which a circuit board unit having electronic circuit portions assembled therein is accommodated in a metal casing (see JP 2001-223489A). The casing includes a frame in the shape of a flat box and a lid member that covers the opening of the frame, and is configured so as to be tightly closed when the frame and the lid member are fastened with screws to each other.

Incidentally, the metal casing is relatively thin, and thus, when it is mounted in a vehicle such as an automobile, it easily vibrates, so that the frame and the lid member may hit each other at portions other than the portions having the screws, which may generate abnormal noise. In particular, for example, when an opening is provided through part of the casing such as a portion around a connector or the like, the peripheral edge of the opening has a much lower rigidity, abnormal noise is more likely to be generated.

A technique disclosed in this specification was made in view of these circumstances, and it is an object thereof to provide an electrical junction box in which abnormal noise is not likely to be generated.

A technique disclosed in this specification is directed to an electrical junction box in which a circuit structure is accommodated in a casing, wherein the casing includes a casing main body made of synthetic resin in which the circuit structure is accommodated, and a cover made of metal attached to the casing main body, covering the circuit structure, an opening is provided at an edge of a peripheral wall of at least one of the casing main body and the cover, a peripheral wall of one of the casing main body and the cover is provided with a through tab extending toward the other, and a peripheral wall of the other is provided with a through portion protruding outward in which the through tab can be received, and the through tab or the through portion is arranged adjacent to the opening.

With this configuration, since the casing main body is made of synthetic resin, the level of abnormal noise generated can be reduced compared with a configuration in which the casing main body is made of metal so that the members made of metal abut against each other in a large area. Furthermore, since portions that have a low rigidity and are likely to vibrate, such as a portion around the opening, are provided with the through tab and the through portion, they are prevented from hitting each other due to vibration, so that generation of abnormal noise itself can be suppressed.

It is preferable that a width of a front end of the through tab is made smaller by a stepped portion. With this configuration, during assembly of the casing main body with the cover, the stepped portion of the through tab abuts against the end face of the through portion at the correct assembly depth, and thus the casing main body and the cover are prevented from being assembled with each other excessively deeply.

Furthermore, it is possible that a front end of the through tab is provided with a tapered face. With this configuration, the through tab can be smoothly inserted into the through portion.

Furthermore, it is possible that the through tab is provided on the cover. With this configuration, the casing can be produced more easily compared with a case in which the through portion is provided in the cover.

Moreover, it is possible that the casing main body includes a connector portion that is connectable to an external device, and that position in the cover that corresponds to the connector portion is provided with the opening from which the connector portion is exposed to the outside, the connector portion has a connector housing that is separate from the casing main body, and the connector housing includes a tubular hood portion that can receive a corresponding connector, and a flange portion laterally extending in the shape of a flange from a side face of the hood portion, and arranged along an inner face of the peripheral wall of the casing main body or the peripheral wall of the cover.

With this configuration, when detaching a corresponding connector from the connector portion, the flange portion abuts against the peripheral wall of the casing main body or the peripheral wall of the cover, the connector housing is prevented from being dislodged from the casing. Moreover, that portion of the casing that abuts against the flange portion has an increased strength due to the through tab and the through portion, and thus the other fastening structures of the connector housing to the casing can be made smaller or more simple.

According to the technique described in this specification, it is possible to provide an electrical junction box in which abnormal noise is not likely to be generated.

Hereinafter, Embodiment 3 will be described with reference to FIGS. 11 to 20.

An electrical junction box 110 is arranged, for example, in a power supply path between a power source such as a battery of a vehicle such as an electric automobile or a hybrid automobile and a load constituted by a vehicle-mounted electrical equipment such as a lamp, a drive motor, or the like, and can be used, for example, for a DC-DC converter, an inverter, and the like. In the description below, the vertical direction will be indicated taking the upper side in FIG. 12 as an upper direction and the lower side as a lower direction, and the front-rear direction will be described taking the left frontward side in FIG. 11 as a front direction and the right inner side as a rear direction.

Figure 11:
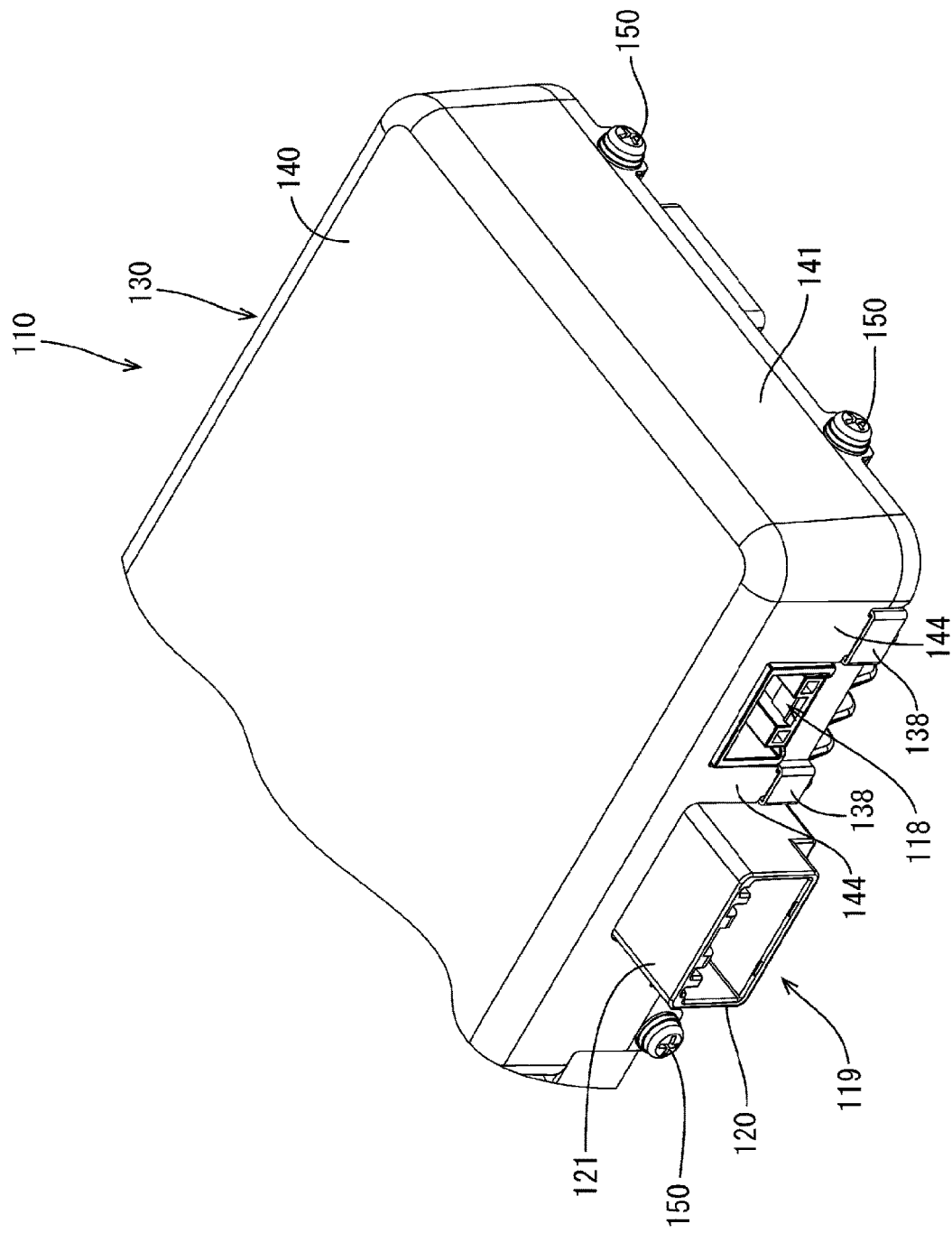
FIG. 11 is a partially enlarged perspective view of an electrical junction box according to Embodiment 3.
Figure 12:
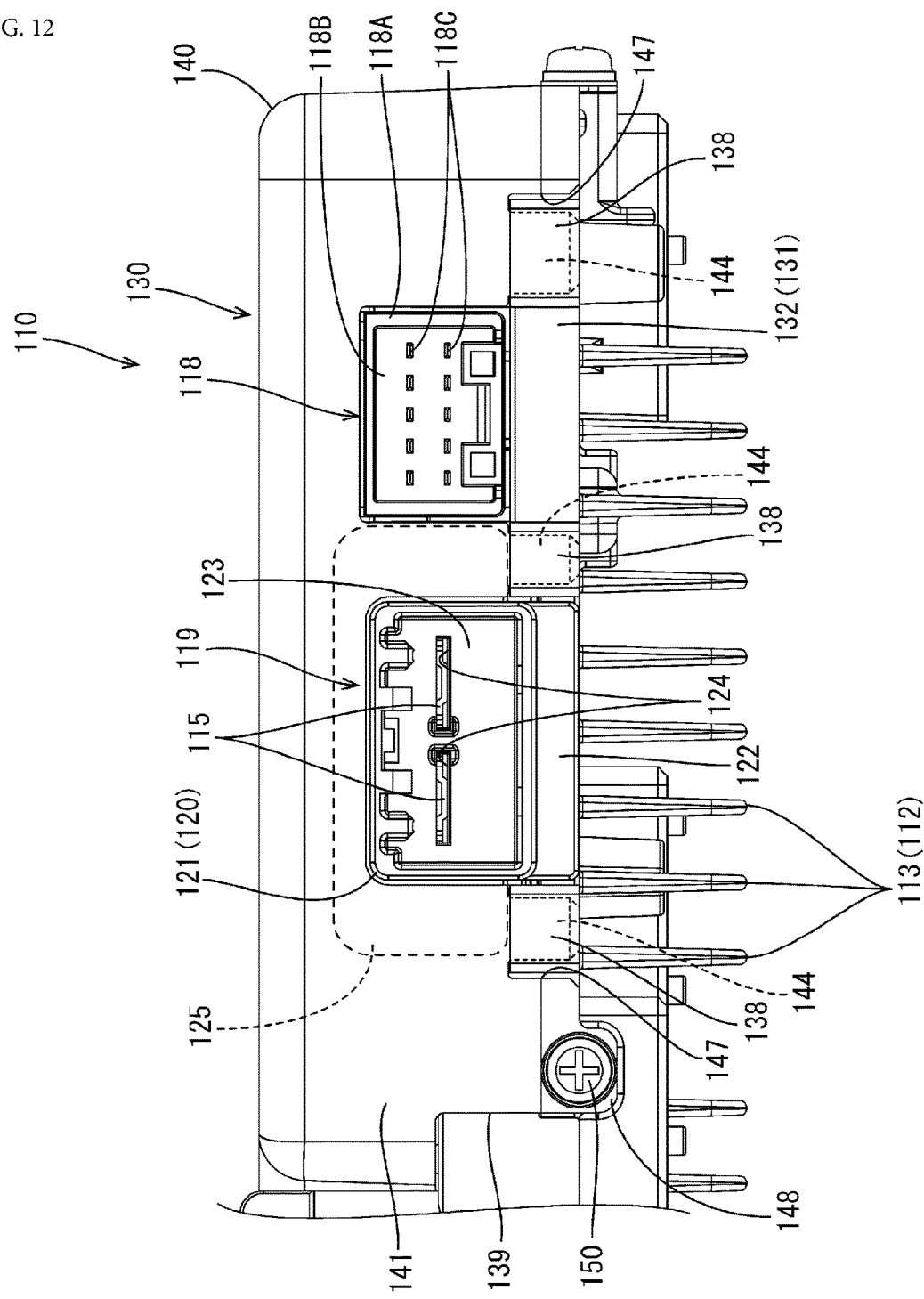
FIG. 12 is a partially enlarged front view thereof.
Figure 13:
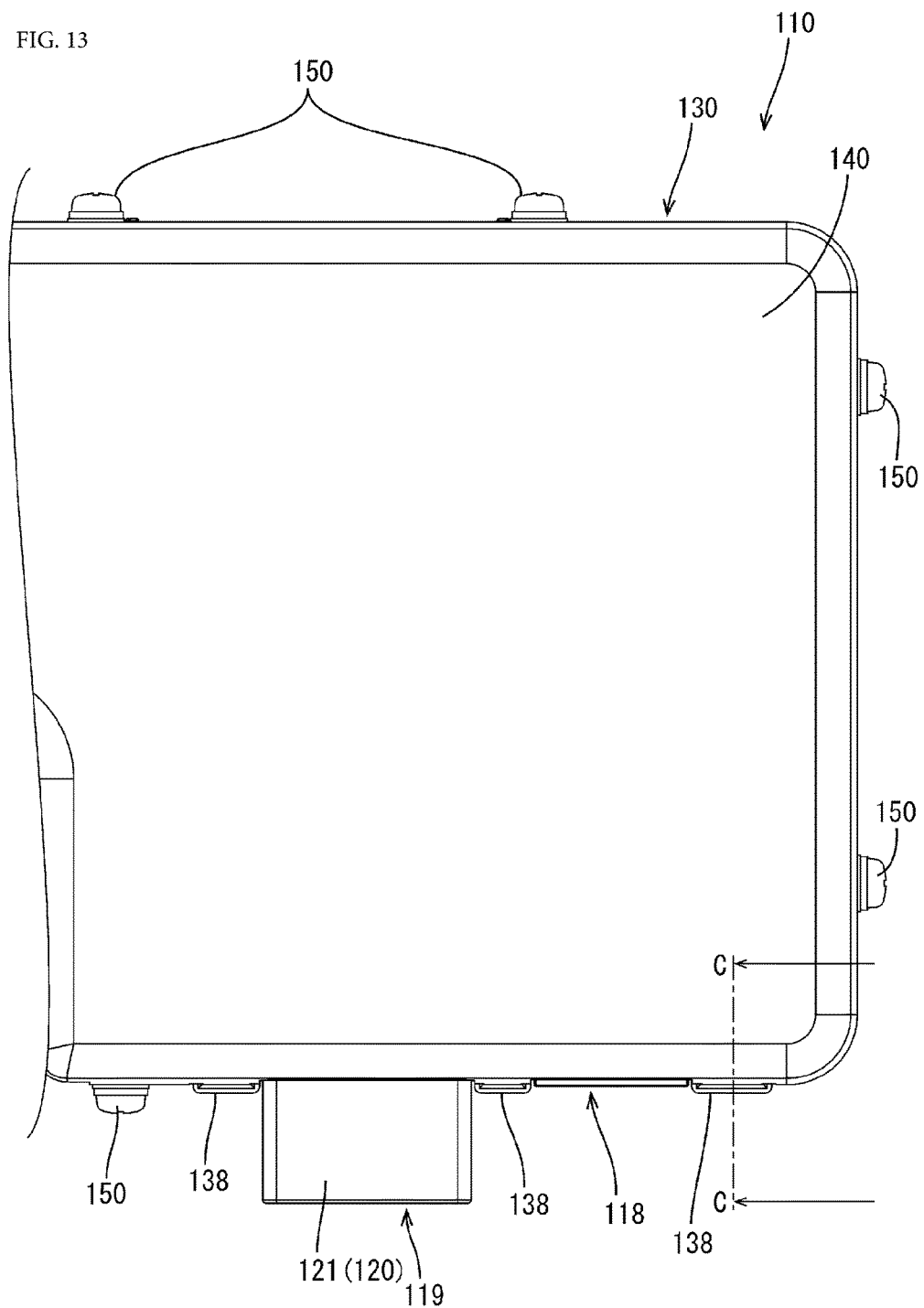
FIG. 13 is a partially enlarged plan view thereof.
Figure 15:
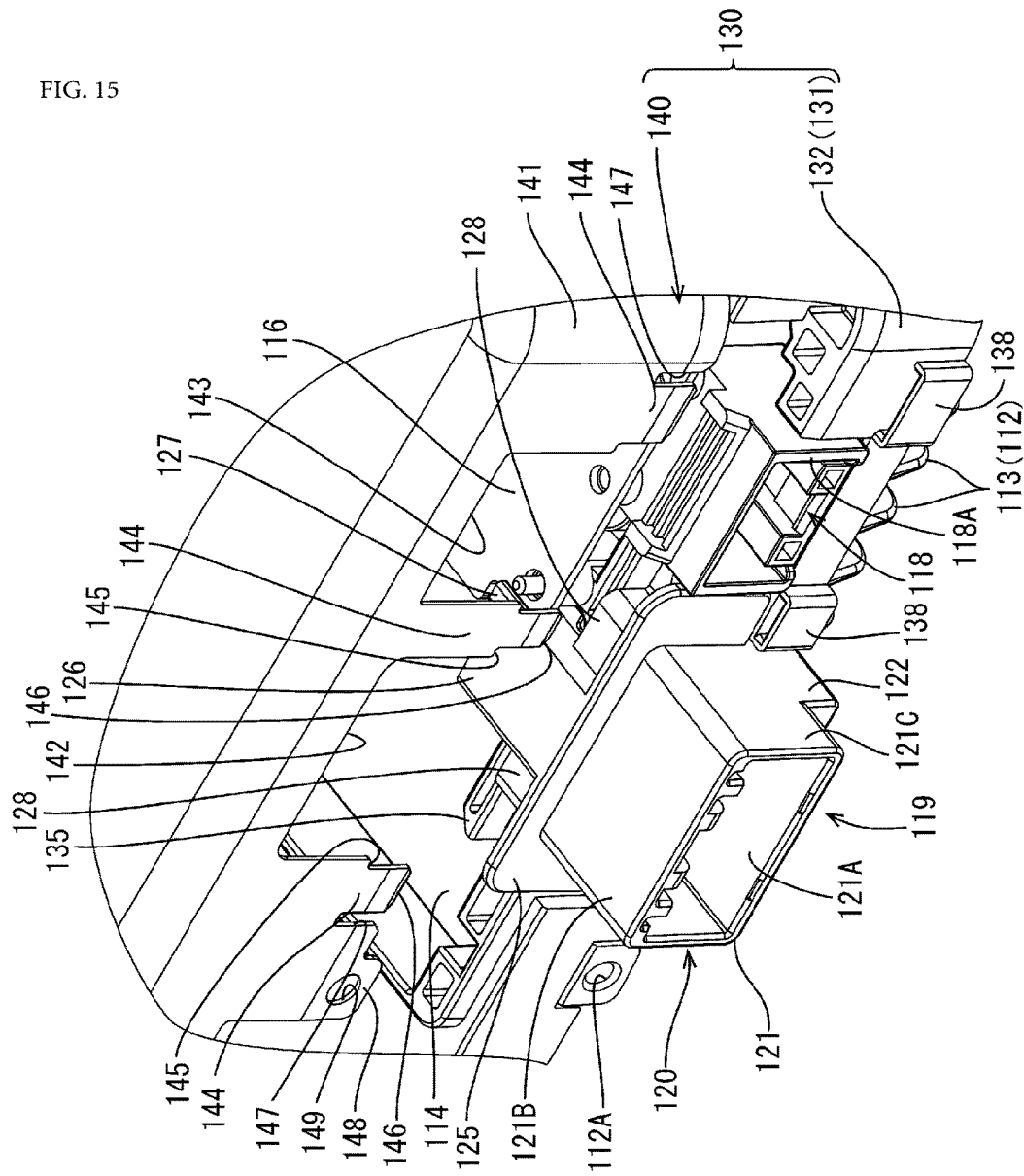
FIG. 15 is a partially enlarged perspective view thereof (after the connector housing is mounted).

As shown in FIG. 11, the electrical junction box 110 includes a casing 130 substantially in the shape of a rectangular solid that accommodates a circuit structure 111. As shown in FIG. 15, the circuit structure 111 includes a heat dissipation member 112, a first circuit board 114 arranged on the upper face of the heat dissipation member 112, a second circuit board 116 arranged above the first circuit board 114 via a predetermined gap so as to be parallel to the first circuit board 114, and a connector portion 119 that can be connected to an external device (not shown).

The heat dissipation member 112 is made of a metal material having a high thermal conductivity such as an aluminum alloy or a copper alloy, and has a flat upper face and a lower face having a large number of heat dissipation fins 113 that are arranged side by side. A plurality of screw holes 112A (see FIG. 14) for fastening a cover 140 (described later) are formed through the outer perimeter of the heat dissipation member 112.

The first circuit board 114 is in the shape of a rectangle that can be fitted into a frame portion 132 of a casing main body 131 (described later), and has a configuration in which a printed wiring board overlaps a plurality of bus bars (not shown). The printed wiring board is configured by an insulating plate made of an insulating material on which a conductive path made of copper foil or the like is formed using a printed wiring technique. The plurality of bus bars are formed by punching metal sheets made of a copper alloy or the like according to the shape of the conductive path, and part of their ends are bent in the shape of cranks to form a pair of connector terminals 115 extending forward (see FIG. 14). The first circuit board 114 are fastened with screws to the upper face of the heat dissipation member 112.

The second circuit board 116 has an area that is smaller than that of the first circuit board 114, and is fastened to the upper portion of the casing main body 131 via a predetermined gap from the first circuit board 114 so as to be parallel to the first circuit board 114. The second circuit board 116 is rectangular, and is configured by an insulating plate made of an insulating material on which a conductive path made of copper foil or the like is printed.

The second circuit board 116 is fastened with screws to a housing 118A of a control connector 118. The housing 118A is made of synthetic resin, and is open in the shape of an angular tube into which a corresponding connector housing can be fitted, wherein L-shaped control terminals 118C are fastened through an inner wall 118B (see FIG. 12).

The conductive path of the first circuit board 114 and the conductive path of the second circuit board 116 are connected to each other via a plurality of terminals (not shown).

In the circuit structure 111, the connector portion 119 that can be connected to an external device (not shown) includes a connector housing 120 made of synthetic resin and the above-described pair of connector terminals 115. As shown in FIGS. 14 to 18, the connector housing 120 includes a hood portion 121, an inner wall 123 that closes the interior of the hood portion 121, a flange portion 125 projecting in the shape of a flange from the side faces of the hood portion 121, and a pair of fastening pieces 128 for fastening to the casing 130.

The hood portion 121 is open forward in the shape of an angular tube, covering a corresponding connector housing (not shown). A bottom wall 121A positioned on the lower side of the peripheral wall of the hood portion 121 is provided with a reinforcing portion 122 extending downward along the entire width. The front face of the reinforcing portion 122 is located behind the front end face of the peripheral wall of the hood portion 121.

Figure 16:
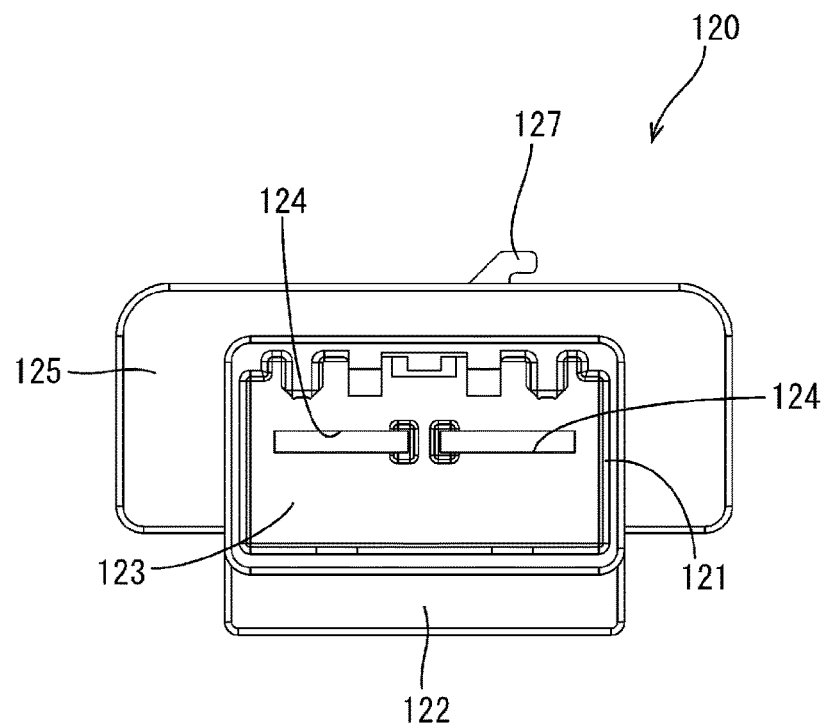
FIG. 16 is a front view of the connector housing.
Figure 17:
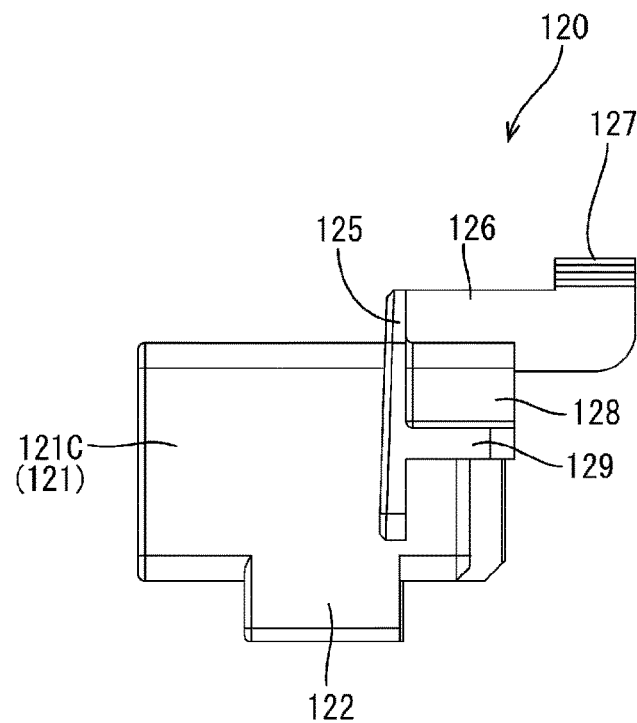
FIG. 17 is a side view of the connector housing.

As shown in FIG. 16, a pair of terminal insertion holes 124 into which the pair of connector terminals 115 are inserted are provided in the inner wall 123. The terminal insertion holes 124 are formed in a size that has slight gaps between the terminal insertion holes 124 and the connector terminals 115.

The flange portion 125 is unitarily formed with the middle in the front-rear direction of the connector housing 120, projecting outward from an upper wall 121B and a side wall 121C of the hood portion 121 such that the projecting length in the horizontal direction is larger than the projecting length in the upper direction. The rear face of the flange portion 125 is set to be flush with the rear face of the reinforcing portion 122 (see FIG. 17).

A receiving portion 126 extending rearward from the middle of the upper end of the flange portion 125 is unitarily formed with the rear face of the flange portion 125. The receiving portion 126 has a cross-section in the shape of a U that is open downward. The upper face of the receiving portion 126 is flush with the upper face of the flange portion 125.

A catch portion 127 that catches the upper face of the second circuit board 116 projects to one side (to the right side in FIGS. 16 and 18) from the rear end of the upper face of the receiving portion 126. The catch portion 127 extends obliquely upward from the upper face of the receiving portion 126 to the outside, and has a front end extending in the horizontal direction (parallel to the upper face of the receiving portion 126).

Furthermore, the pair of fastening pieces 128 in the shape of laterally extending plates are respectively arranged from both side faces of the receiving portion 126. The fastening pieces 128 are bent in the shape of cranks whose front end faces are unitarily contiguous with the rear face of the flange portion 125, covering the connector terminals 115 arranged thereinside. In the fastening pieces 128, the front ends whose heights are made lower in a stepwise manner than the base ends form horizontally extending fastening portions 129, wherein receiving holes 129A into which the shanks of screws 150 are inserted are formed through the centers of the fastening portions 129.

As shown in FIG. 15, the above-described circuit structure 111 is accommodated in the casing 130. The casing 130 includes the casing main body 131 made of synthetic resin and the cover 140 made of metal.

The casing main body 131 includes the frame portion 132 (an example of a peripheral wall) formed in the shape of a frame along the peripheral edge of the heat dissipation member 112. The front face (the left front side in FIG. 15) of the frame portion 132 is partially cut away to form cut-out portions (an example of openings) in which the control connector 118 and the connector portion 119 are arranged.

Figure 14:
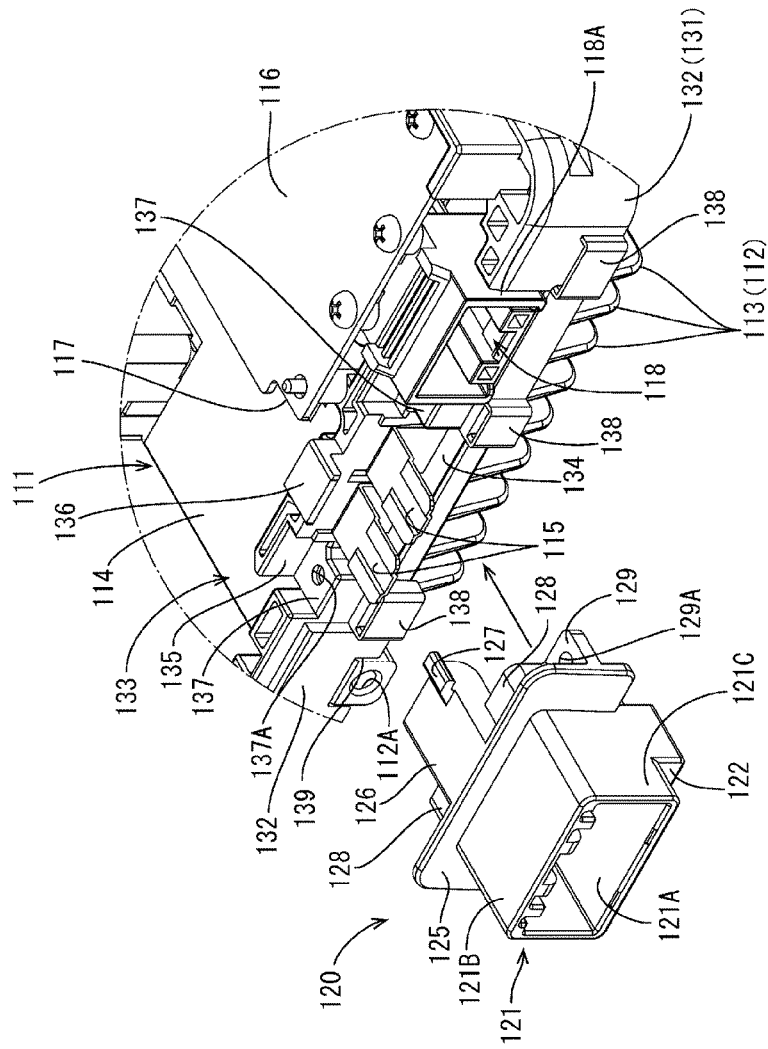
FIG. 14 is a partially enlarged perspective view thereof (before the connector housing is mounted).

As shown in FIG. 14, the connector housing 120 forming the connector portion 119 is separate from the casing main body 131, and is mounted in a connector mounting portion 133 of the casing main body 131. The connector mounting portion 133 includes a terminal mounting portion 134 that is arranged inside the frame portion 132 and in which the pair of connector terminals 115 are mounted, opposing walls 135 arranged behind the terminal mounting portion 134 so as to stand upright in the shape of a band opposing the rear face of the connector housing 120, and a pair of left and right pedestal portions 137 that are arranged near both ends of the front side of the opposing walls 135 and lower than the opposing walls 135.

The front face of the terminal mounting portion 134 is at a position that is closer to the inner side than the front face of the frame portion 132 is (at a position that is closer to the inner side than the outer face of the frame portion 132 is).

The middle in the horizontal direction of the front face of the opposing walls 135 is positioned so as to support, from the rear, the upright portions of the connector terminals 115 mounted in the terminal mounting portion 134 and bent in the shape of cranks. The left and right ends of the front face of the opposing walls 135 are positioned so as to be in contact with the rear end faces of the fastening pieces 128 of the connector housing 120 that has been mounted.

The upper faces of the pedestal portions 137 form placement faces on which the fastening portions 129 of the connector housing 120 are placed, and have the receiving holes 129A into which the screws 150 can be screwed. The front faces of the pedestal portions 137 form abutting faces that abut against the rear face of the flange portion 125 of the connector housing 120. The front faces of the pedestal portions 137 are flush with the front face of the terminal mounting portion 134.

Furthermore, a plate-like guide portion 136 for guiding the orientation of the connector housing 120 with respect to the casing main body 131 by entering the receiving portion 126 of the connector housing 120 projects forward in the shape of an L from the middle in the horizontal direction of the upper end of the opposing walls 135.

The above-described control connector 118 is arranged on the right side in FIG. 14 of and adjacent to the connector mounting portion 133, via a predetermined gap from the connector mounting portion 133.

Moreover, the front face of the frame portion 132 is provided with a plurality of through portions 138 into which through tabs 144 of the cover 140 (described later) are inserted. The through portions 138 have a shape protruding forward at the lower end of the front face of the frame portion 132 and have through holes extending in the vertical direction.

The through portions 138 are arranged on both sides of and adjacent to the connector mounting portion 133 (the connector portion 119) and the control connector 118. In other words, the through portions 138 are arranged adjacent to the cut-out portions of the frame portion 132 in which the connector portion 119 and the control connector 118 are arranged. Specifically, in FIG. 14, three through portions 138 are respectively arranged adjacent to the left end of the connector mounting portion 133, between the connector mounting portion 133 and the control connector 118, and adjacent to the right end of the control connector 118.

The three through portions 138 have different widths depending on their arrangement positions, adapted to the exterior shape of the casing main body 131 (the frame portion 132).

Note that the left end in FIG. 14 of the frame portion 132 is provided with a cut-out portion 139 formed by cutting away the lower end to the upper side in a rectangular shape, and a screw hole 112A of the above-described heat dissipation member 112 is exposed from the cut-out portion 139.

As shown in FIG. 15, in a state where the connector housing 120 is mounted in the correct position at the connector mounting portion 133, the connector terminals 115 are inserted through the terminal insertion holes 124 of the inner wall 123 and are arranged at the correct positions. Furthermore, one edge of the receiving portion 126 and the base end of the catch portion 127 are arranged inside a cut-out portion 117 formed by cutting away the corner of the second circuit board 116 in a rectangular shape, and the horizontally extending front end of the catch portion 127 overlaps the edge of the cut-out portion 117.

Furthermore, the rear end faces of the pair of fastening pieces 128 abut against the opposing walls 135, and the fastening portions 129 overlap the upper faces of the pedestal portions 137, so that screwing can be performed.

Moreover, the rear face of the flange portion 125 abuts against the front faces of the pedestal portions 137, and the front face of the flange portion 125 is substantially flush with the front face of the frame portion 132.

Furthermore, the rear face of the reinforcing portion 122 abuts against the front face of the terminal mounting portion 134.

Figure 19:
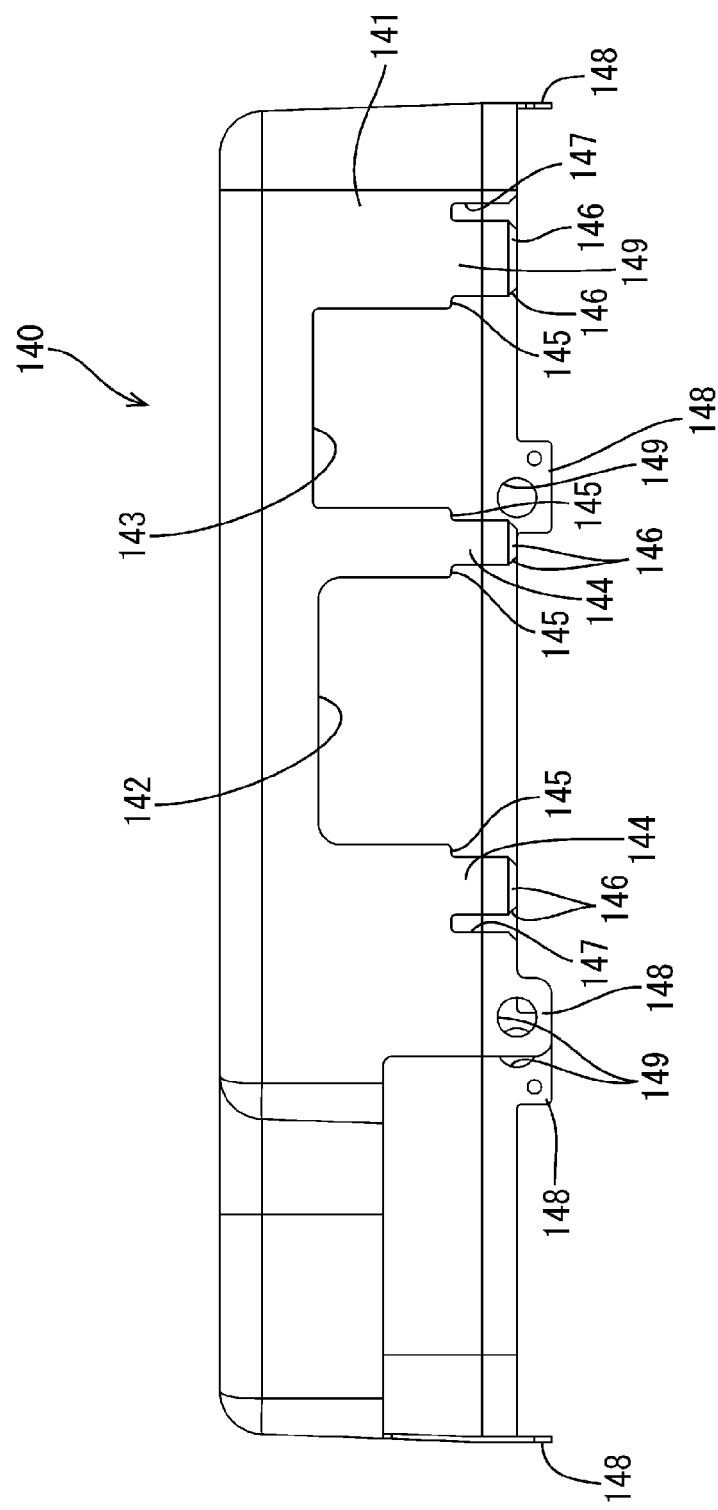
FIG. 19 is a front view of a cover.

Meanwhile, the cover 140 is formed in the shape of a bottomless box, by punching and bending a metal sheet made of aluminum or the like. As shown in FIGS. 15 and 19, in a peripheral wall 141 of the cover 140, the regions corresponding to the connector portion 119 and the control connector 118 described above are respectively provided with a first opening 142 and a second opening 143 formed by cutting away the lower edges to the upper side substantially in rectangular shapes adapted to the exterior shapes of the connector housings 120 and 118A.

In the peripheral wall 141, the region left between the first opening 142 and the second opening 143 is in the shape of an elongated piece extending downward from the upper edges of the openings 142 and 143, and this tap-shaped portion forms a through tab 144 that can be inserted into one of the above-described through portions 138.

The lateral width at the lower end of the through tab 144 is made smaller by stepped portions 145 so that the lower end can be inserted into the through portion 138. The lateral width at this lower end is set to be slightly smaller than the width of the inner side of the through portion 138. Furthermore, the corners at the lower end on the outer face of the through tab 144 and the corners at the lower ends on the side faces form guide faces 146 (an example of tapered faces) formed by obliquely cutting the corners downward, so that the through tab 144 can be swiftly inserted into the through portion 138.

Furthermore, the stepped portions 145 form abutting faces for the upper face of the through portion 138. That is to say, when the cover 140 is arranged at the correct position with respect to the casing main body 131, the stepped portions 145 are positioned so as to prevent the through tab 144 from being excessively inserted into the through portion 138.

Furthermore, in FIG. 19, slits 147 extending upward from the lower edge of the peripheral wall 141 via a predetermined gap from the side edges of the openings 142 and 143 are formed on the left side of the first opening 142 and the right side of the second opening 143. The tab-shaped portions extending downward between these slits 147 and the side edges of the openings 142 and 143 form through tabs 144 that can be inserted into the other through portions 138. In a similar manner, these through tabs 144 are such that their lower ends (front ends) are provided with stepped portions 145 and the corners at their lower ends form guide faces 146.

Furthermore, on the lower edge of the peripheral wall 141, the regions corresponding to the screw holes 112A of the above-described heat dissipation member 112 are provided with extending portions 148 extending downward, and the extending portions 148 are provided with screw holes 149 into which the screws 150 are inserted. If the screws 150 are inserted into the screw holes 149 and are screwed into the screw holes 112A of the heat dissipation member 112, the cover 140 is fastened to the heat dissipation member 112, and is grounded via the heat dissipation member 11.

Next, the assembly procedure of the electrical junction box 110 will be described.

First, the frame portion 132 (the casing main body 131) is attached to the heat dissipation member 112 so as to surround the heat dissipation member 112, and the first circuit board 114 is arranged on the upper face of the heat dissipation member 112. Furthermore, the control connector 118 and the second circuit board 116 are placed on and fastened to predetermined points in the casing main body 131.

Next, as shown in FIG. 14, the connector housing 120 is moved in the arrow direction in the drawing toward the connector mounting portion 133 of the casing main body 131. Thus, the receiving portion 126 is guided along the guide portion 136, and the connector housing 120 is mounted in the connector mounting portion 133 (the casing main body 131).

When the connector housing 120 is mounted, the connector terminals 115 are inserted into the terminal insertion holes 124. Furthermore, the catch portion 127 formed on the receiving portion 126 enters the cut-out portion 117 of the second circuit board 116, and overlaps the upper face of the edge of the cut-out portion 117.

Furthermore, the rear end faces of the pair of fastening pieces 128 abut against the opposing walls 135, and the fastening portions 129 overlap the upper faces of the pedestal portions 137. Moreover, the rear face of the flange portion 125 abuts against the front faces of the pedestal portions 137, and the rear face of the reinforcing portion 122 abuts against the front face of the terminal mounting portion 134. Accordingly, the connector housing 120 is positioned with respect to the casing main body 131.

When the connector housing 120 is mounted in the correct position in the connector mounting portion 133, the receiving holes 129A of the fastening portions 129 and fastening holes 137A of the pedestal portions 137 are fastened to each other with the screws 150, so that the connector housing 120 is fastened to the casing main body 131.

In this state, the front face of the flange portion 125 is substantially flush with the front face (outer face) of the frame portion 132.

When the connector housing 120 is fastened to the predetermined position in the casing main body 131 in this manner, the cover 140 is moved closer from above such that the through tabs 144 are inserted into the through portions 138, and the cover 140 is attached to the casing main body 131, covering the circuit structure 111. At this time, the guide faces 146 are formed at the front ends of the through tabs 144, and thus the through tabs 144 can be smoothly inserted into the through portions 138 while being guided along the guide faces 146. Furthermore, when the cover 140 is arranged at the correct position with respect to the casing main body 131, the stepped portions 145 of the through tabs 144 abut against the upper faces of the through portions 138, so that the through tabs 144 are prevented from being excessively inserted into the through portions 138.

Lastly, the screws 150 are inserted and screwed into the screw holes 149 of the cover 140 and the screw holes 112A of the heat dissipation member 112, the screw holes overlapping each other. Accordingly, the cover 140 is fastened to the casing main body 131.

Figure 18:
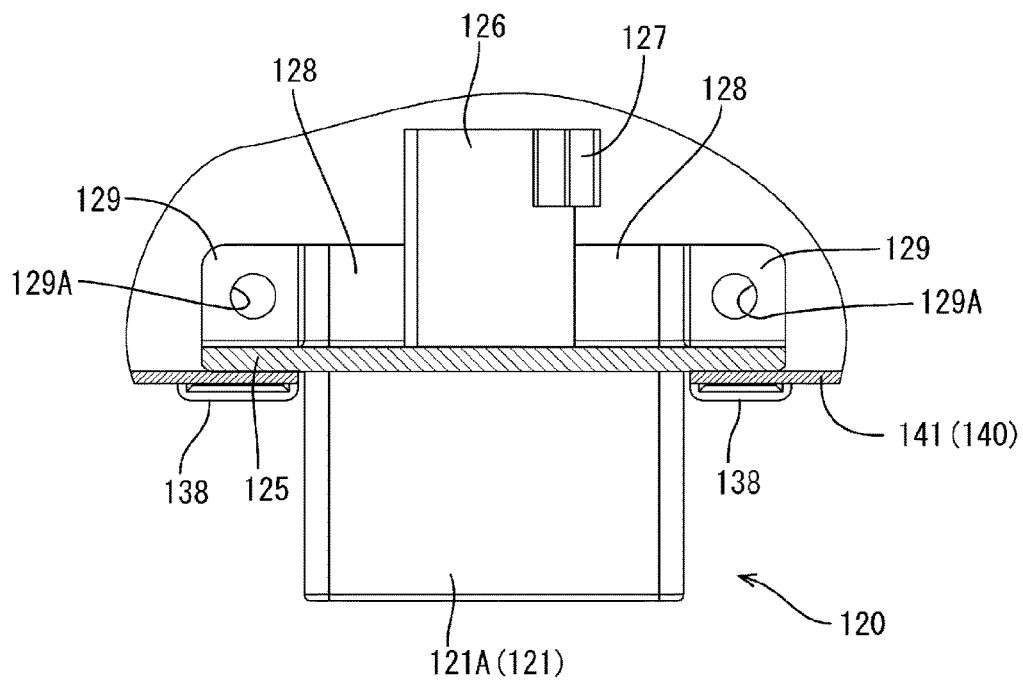
FIG. 18 is a horizontal cross-sectional view of the connector housing accommodated in a casing.
Figure 20:
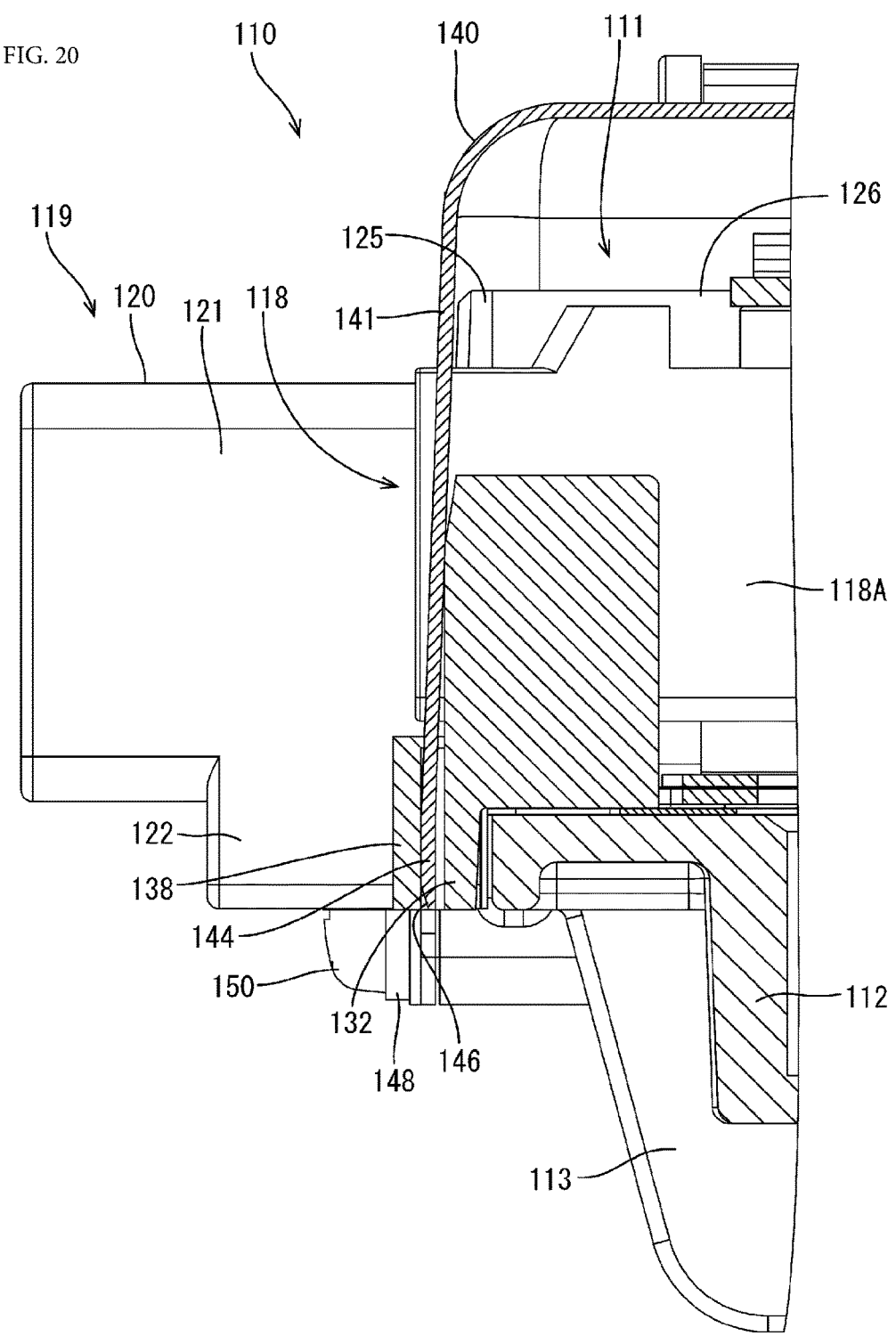
FIG. 20 is a cross-sectional view taken along C-C in FIG. 13.

In this state, the front face of the flange portion 125 of the connector housing 120 is arranged along the inner face of the peripheral wall 141 of the cover 140 (see FIGS. 18 and 20).

Hereinafter, the actions and effects of the foregoing embodiment will be described.

According to this embodiment, the casing 130 is configured by the cover 140 made of metal and the casing main body 131 made of synthetic resin, and members made of metal do not directly hit each other when vibration is generated, and thus, even when they are mounted in a vehicle and vibration is applied thereto, the level of abnormal noise generated can be suppressed.

Moreover, the casing 130 is configured such that portions that have a low rigidity and are likely to vibrate, such as those around the connector portion 119 and the control connector 118 and around the openings 142 and 143, are provided with the through tabs 144 and the through portions 138, and the casing main body 131 and the cover 140 are fastened to each other, so that generation of abnormal noise itself can be suppressed.

Moreover, the through tabs 144 and the through portions 138 can be easily seen and can be easily positioned.

Furthermore, since the through tabs 144 are provided with the stepped portions 145, during assembly of the cover 140 to the casing main body 131, the stepped portions 145 abut against the upper end faces of the through portions 138, and thus the cover 140 can be prevented from being excessively lowered with respect to the casing main body 131.

Furthermore, since the front ends of the through tabs 144 are provided with the guide faces 146, the guide faces 146 can guide the through tabs 144 so that the through tabs 144 are smoothly inserted into the through portions 138.

Furthermore, since the through tabs 144 are provided on the cover 140 side and the through portions 138 are provided on the casing main body 131 side, the casing 130 can be produced more easily and at a lower cost compared with a case in which they are provided on the opposite sides.

Furthermore, the connector housing 120 is provided with the flange portion 125 so that, when the cover 140 is assembled to the casing main body 131, the flange portion 125 is arranged along the inner face of the peripheral wall 141 of the cover 140 (see FIGS. 18 and 20), and thus, when detaching a corresponding connector from the connector portion 119, the flange portion 125 is in contact with the inner face of the peripheral wall 141 of the cover 140 and functions as a dislodgement preventing member. Moreover, in the peripheral wall 141, part of the portion is in contact with the flange portion 125 is formed as the through tabs 144, and the front ends of the through tabs 144 are inserted into the through portions 138 to increase the strength, and thus, even when a large is applied thereto, the dislodgement preventing member can reliably exert its function. That is to say, the other fastening structures of the connector housing 120 to the casing main body 131 can be made smaller or more simple.

Other Embodiments

The present invention is not limited to the embodiments described above with reference to the drawings, and the technical scope thereof also encompasses, for example, embodiments as below.

(1) Although the configuration was shown in which the catch portion 48 is formed on the receiving portion 45, the catch portion may be arranged on a portion other than the receiving portion 45. For example, a catch portion that catches the circuit board 35 may be arranged on a portion of the connector housing other than the portion of the receiving portion 45.

(2) The position holding hole 38 and the holding portion 26 may not be provided.

Figure 21:
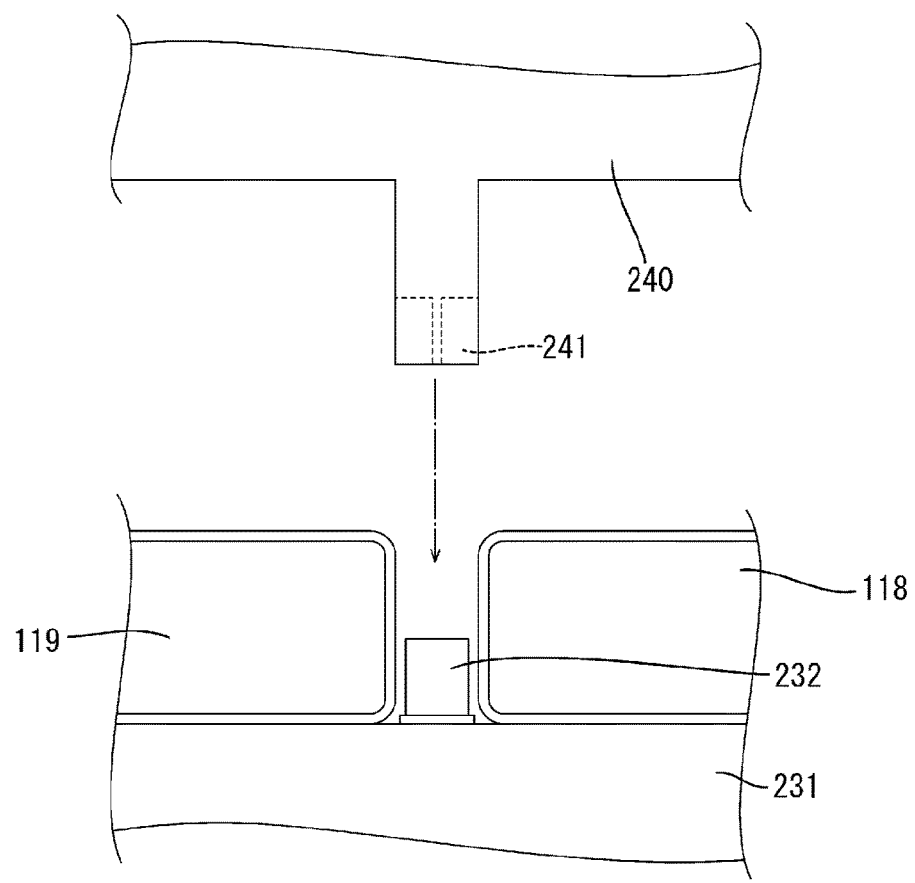
FIG. 21 is a partially enlarged front view of an electrical junction box according to another embodiment (3) (when the casing is open).
Figure 22:
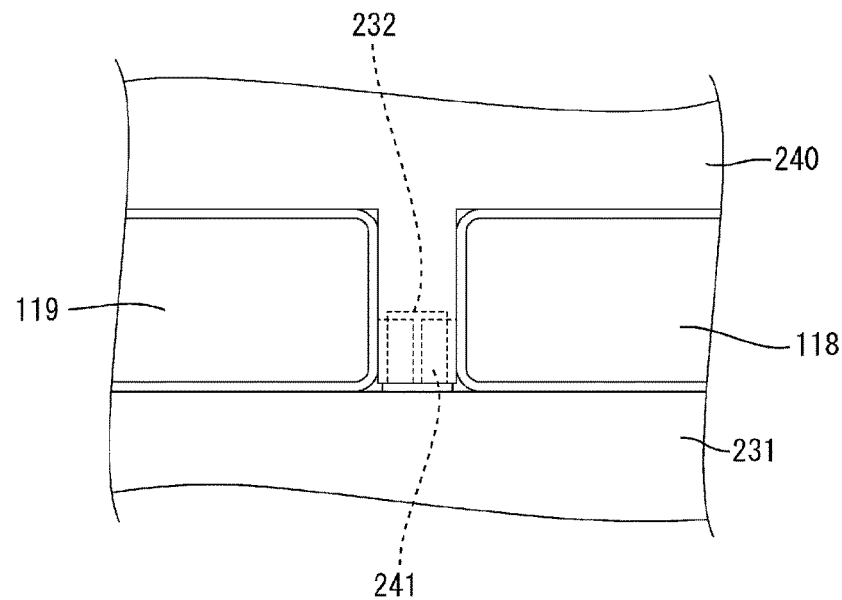
FIG. 22 is a partially enlarged front view thereof (when the casing is closed).
Figure 23:
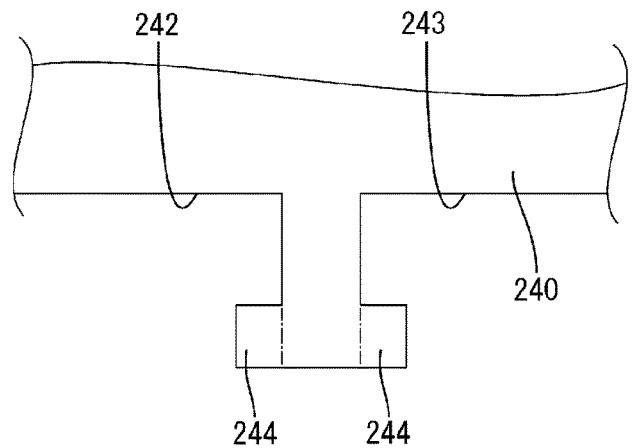
FIG. 23 is a partially enlarged unfolded view of the cover thereof.

(3) In the foregoing embodiment, the through portions 138 are provided in the casing main body 131 and the through tabs 144 are provided on the cover 140, but the opposite configuration is possible. That is to say, as shown in FIGS. 21 to 23, a through portion 241 may be provided in a cover 240 and a through tab 232 may be provided on a casing main body 231.

The through tab 232 may be formed by providing the casing main body 231 with a projecting piece extending upward. Furthermore, for example, as shown in FIG. 23, the through portion 241 may be formed by providing the side edges of an opening 242 of the cover 240 with a pair of extending portions 244 laterally extending from the side edges and folding back the extending portions 244.

(4) The form of the through tabs 144 is not limited to that in the foregoing embodiment, and may be changed as appropriate. For example, the stepped portions 145 and the guide faces 146 do not absolutely have to be provided, and may be omitted. Furthermore, for example, in order to prevent the through tabs 144 from vibrating inside the through portions 138, the through tabs 144 may have a wavy surface that is concavo-convex in the board surface direction, or the through tabs 144 may be provided with elasticity imparting portions protruding in the width direction.

(5) The configuration of the connector housing 120 is not limited to that in the foregoing embodiment, and may be other configurations. For example, the flange portion 125 may be omitted.

(6) In the foregoing embodiment, the connector portion 119 is configured by the connector housing 120 that is separate from the casing main body 131 and is attached to the connector mounting portion 133, but may be configured by a connector housing formed unitarily with the casing main body 131.

(7) In the foregoing embodiment, the flange portion 125 of the connector housing 120 is arranged along the inner face of the peripheral wall 141 of the cover 140, but may be arranged along the inner face of the frame portion 132 of the casing main body 131. Also in this case, the flange portion 125 functions as a dislodgement preventing member.

The invention claimed is:

1. An electrical junction box, comprising:
   a circuit board in which a conductive path is formed on an insulating plate;
   a connector housing having a hood portion in the shape of a hood and an inner wall that closes the hood portion, wherein a terminal insertion hole is provided in the inner wall;
   a connector terminal that is inserted from a rear face of the connector housing into the terminal insertion hole through the inner wall and projects into the hood portion;
   a base member to which the connector housing is fastened, and that is different from the circuit board, wherein the base member includes a holding portion that holds a position of a portion of the circuit board that is on the side of the connector housing; and
   a fastening portion that fastens the connector housing to the base member in a state where the connector terminal is inserted into the terminal insertion hole;
   wherein the connector housing includes a catch portion that catches the circuit board in a state where the connector housing is fastened with the fastening portion to the base member.

2. The electrical junction box according to claim 1, wherein the fastening portion is a screw.

3. The electrical junction box according to claim 1, wherein a position holding hole is formed through the circuit board, and
   the holding portion includes a projecting portion that is inserted into the position holding hole.

4. The electrical junction box according to claim 1, wherein the catch portion includes a pair of gripping portions that grip the circuit board from both faces.

5. The electrical junction box according to claim 1, wherein the base member includes a guide portion that guides the connector housing during assembly of the connector housing, and the connector housing includes a receiving portion that receives the guide portion to be guided therealong, and
   the catch portion is formed on the receiving portion.

6. The electrical junction box according to claim 5, wherein the circuit board is provided with a cut-out portion formed by cutting away a corner of the circuit board, and the receiving portion enters the cut-out portion.

7. A connector housing that is mountable in a base member, comprising:
   a hood portion in the shape of a hood;
   an inner wall that closes the hood portion, and is provided with a terminal insertion hole into which a connector terminal is insertable from a rear face of the inner wall;
   a fastenable portion to which a fastening portion is fastened with respect to the base member; and
   a receiving portion extending from the hood portion;
   a catch portion that laterally projects from a side edge of the receiving portion, the catch portion catches a circuit board in which a conductive path is formed on an insulating plate, in a state where the fastenable portion is fastened with the fastening portion to the base member.

8. An electrical junction box in which a circuit structure is accommodated in a casing,
   wherein the casing includes a casing main body made of synthetic resin in which the circuit structure is accommodated, and a cover made of metal attached to the casing main body, covering the circuit structure,
   an opening is provided at an edge of a peripheral wall of at least one of the casing main body and the cover,
   a peripheral wall of one of the casing main body and the cover is provided with a through tab extending toward the other, and a peripheral wall of the other is provided with a through portion protruding outward in which the through tab can be received,
   the through tab or the through portion is arranged adjacent to the opening;
   a connector housing that is separate from the casing main body and disposed within the opening of the edge of the peripheral wall of at least one of the casing main body and the cover; and
   the connector housing includes a tubular hood portion that can receive a corresponding connector, a receiving portion and a flange portion laterally extending in the shape of a flange from a side face of the hood portion separating the hood portion from the receiving portion, the flange portion arranged along an inner face of the peripheral wall of the casing main body or the peripheral wall of the cover; and
   a catch portion that laterally projects from a side edge of the receiving portion, the catch portion catches a circuit board in which a conductive path is formed on an insulating plate, in a state where the fastenable portion is fastened with the fastening portion to the base member.

9. The electrical junction box according to claim 8, wherein a width of a front end of the through tab is made smaller by a stepped portion.

10. The electrical junction box according to claim 8, wherein a front end of the through tab is provided with a tapered face.

11. The electrical junction box according to claim 8, wherein the through tab is provided on the cover.

12. The electrical junction box according to claim 8, wherein the casing main body includes a connector portion that is connectable to an external device, and that position in the cover that corresponds to the connector portion is provided with the opening from which the connector portion is exposed to the outside,
    the connector portion has the connector housing, the connector housing having:
    a hood portion in the shape of a hood;
    a receiving portion extending from the hood portion;
    a catch portion that laterally projects from a side edge of the receiving portion, the catch portion catches a circuit board in which a conductive path is formed on an insulating plate, in a state where a fastenable portion is fastened with the fastening portion to the casing.

13. The electrical junction box according to claim 3, wherein the catch portion includes a pair of gripping portions that grip the circuit board from both faces.

14. The electrical junction box according to claim 4, wherein the base member includes a guide portion that guides the connector housing during assembly of the connector housing, and the connector housing includes a receiving portion that receives the guide portion to be guided therealong, and
    the catch portion is formed on the receiving portion.

15. The electrical junction box according to claim 10, wherein the through tab is provided on the cover.

* * * * *